(12) United States Patent  (10) Patent No.: US 8,169,518 B2
Ota  (45) Date of Patent: May 1, 2012

(54) IMAGE PICKUP APPARATUS AND SIGNAL PROCESSING METHOD

(75) Inventor: Motoari Ota, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 778 days.

(21) Appl. No.: 12/190,198

(22) Filed: Aug. 12, 2008

(65) Prior Publication Data

US 2009/0046185 A1    Feb. 19, 2009

(30) Foreign Application Priority Data

Aug. 14, 2007   (JP) ................ 2007-211507
Aug. 14, 2007   (JP) ................ 2007-211508

(51) Int. Cl.
    *H04N 3/14*    (2006.01)
(52) U.S. Cl. .................... 348/294; 348/277
(58) Field of Classification Search .......... 348/294
    See application file for complete search history.

(56) References Cited

U.S. PATENT DOCUMENTS

| | | | |
|---|---|---|---|
| 6,211,521 B1* | 4/2001 | Bawolek et al. | 250/339.02 |
| 7,282,696 B2* | 10/2007 | Matsuyama et al. | 250/226 |
| 2004/0051790 A1* | 3/2004 | Tamaru et al. | 348/223.1 |
| 2005/0225656 A1* | 10/2005 | Ihama | 348/272 |
| 2006/0186322 A1* | 8/2006 | Matsuyama | 250/226 |
| 2007/0001094 A1* | 1/2007 | Rhodes | 250/208.1 |
| 2007/0153099 A1* | 7/2007 | Ohki et al. | 348/234 |
| 2008/0079806 A1* | 4/2008 | Inuiya et al. | 348/65 |
| 2008/0079807 A1* | 4/2008 | Inuiya et al. | 348/70 |
| 2008/0218597 A1* | 9/2008 | Cho | 348/222.1 |
| 2008/0278592 A1* | 11/2008 | Kuno et al. | 348/222.1 |

FOREIGN PATENT DOCUMENTS

JP    2004-48445 A    2/2004

* cited by examiner

*Primary Examiner* — Nhan T Tran
*Assistant Examiner* — Amy Hsu
(74) *Attorney, Agent, or Firm* — Sughrue Mion, PLLC

(57) ABSTRACT

An image pickup apparatus includes: a solid-state image sensing device that includes a plurality of pixels, each of the pixels including: a photoelectric conversion film; and a photoelectric conversion element that is formed in the semiconductor substrate below the photoelectric conversion film, are made up of at least three types of photoelectric conversion elements for detecting light in different wave ranges, of visible light, and absorbs light in a wave range different from the wave ranges detected in the at least three types of photoelectric conversion elements and generates a charge responsive to the absorbed light, the image pickup apparatus further including: a monochrome image data generation unit; a color image data generation unit; and a record image data generation unit.

12 Claims, 13 Drawing Sheets

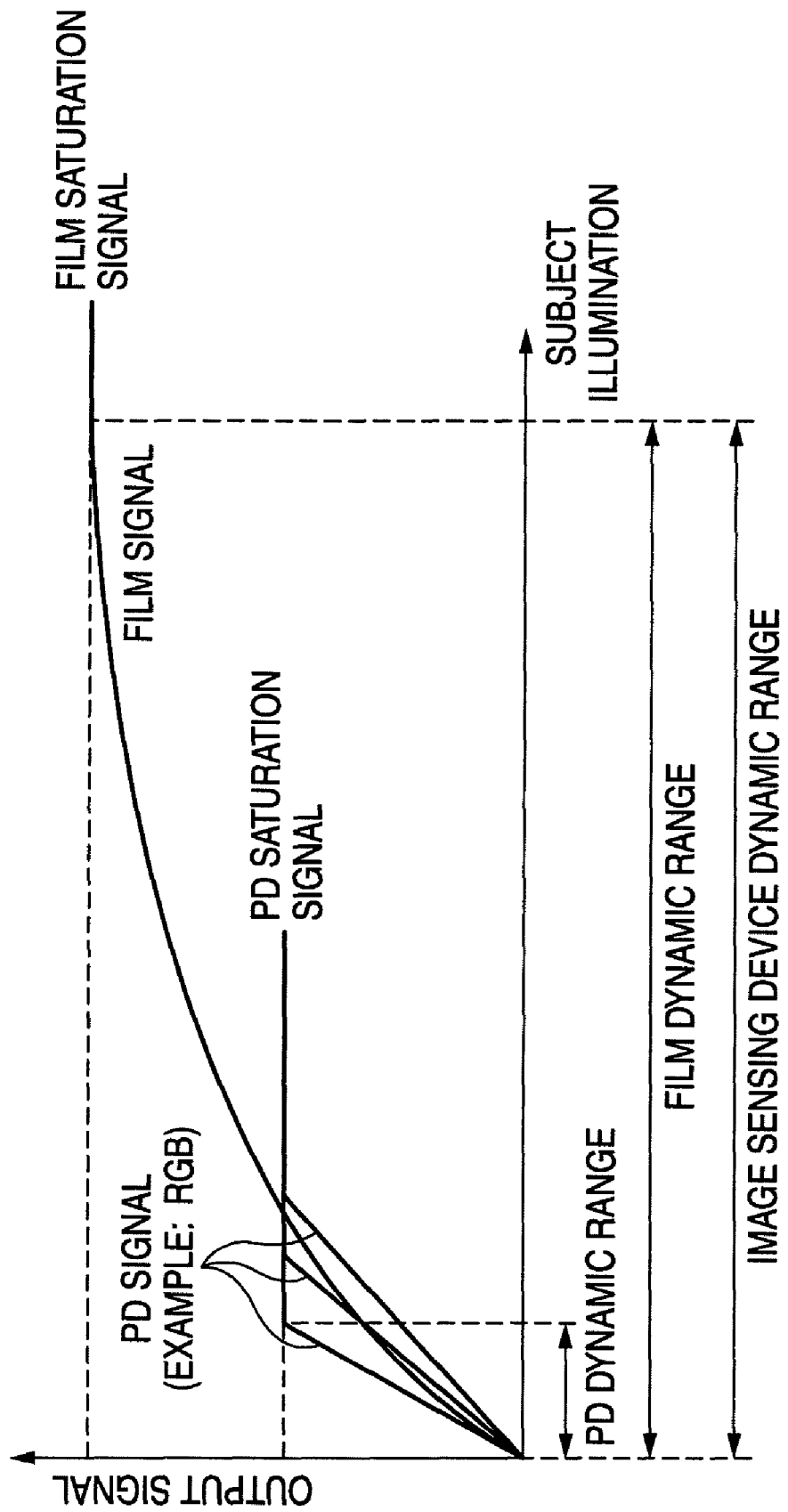

FILM PICKED-UP IMAGE

CONTOUR IMAGE

HIGH-ILLUMINATION AREA
SUBJECT

PD PICKED-UP IMAGE

COMPOSITE PICKED-UP IMAGE (WITH CONTOURS REPRODUCED)

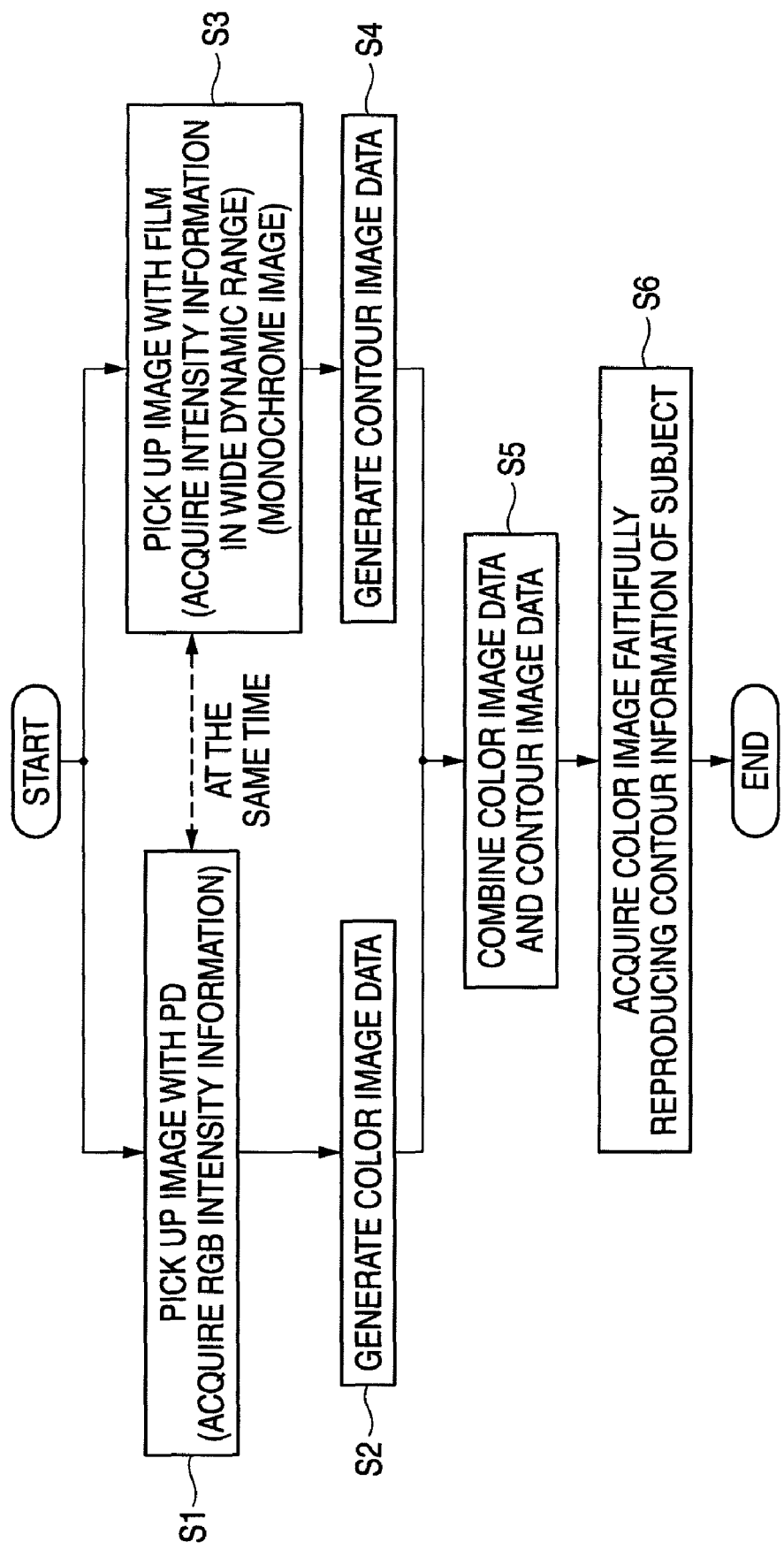

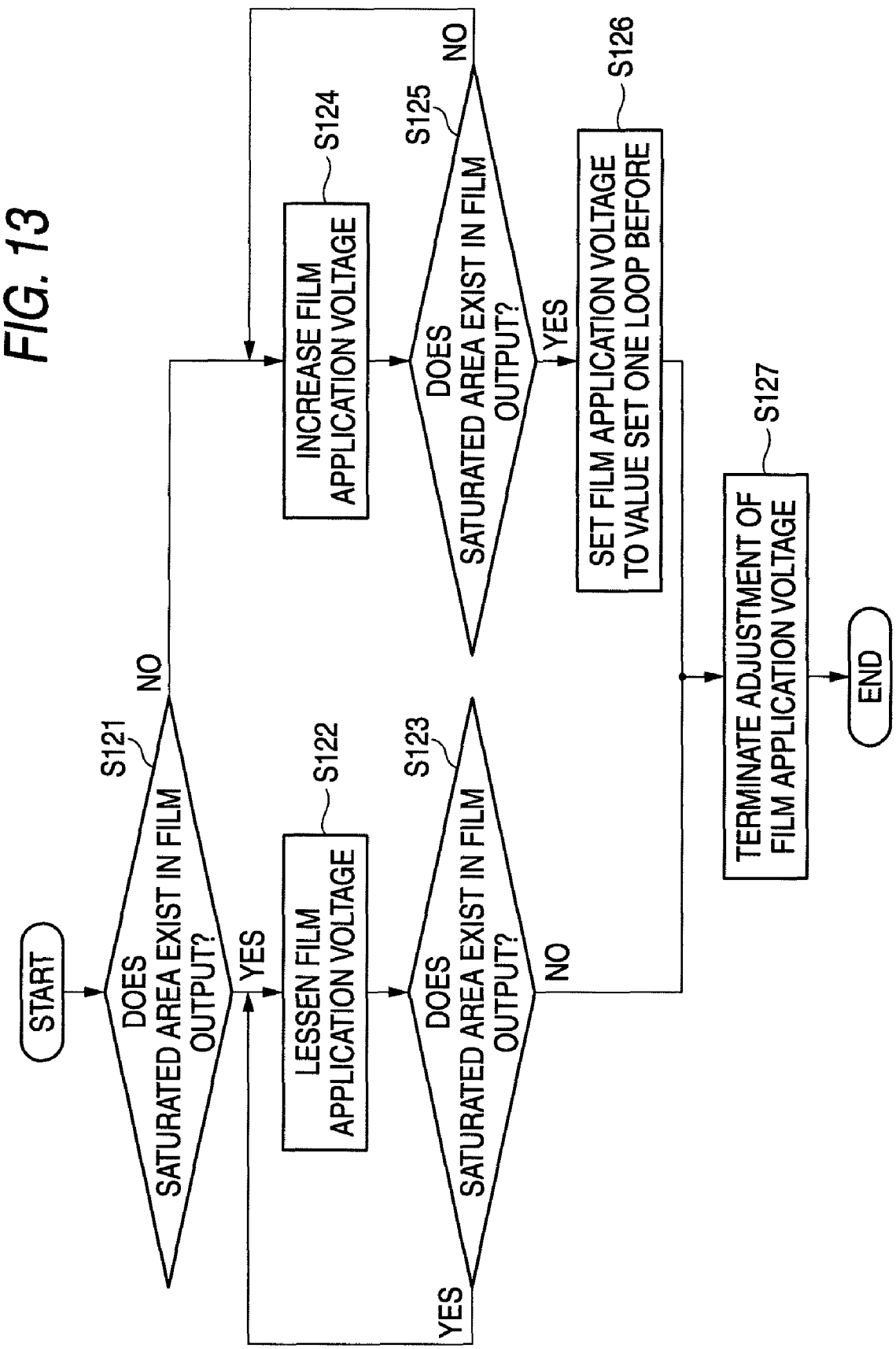

IMAGE PICKUP APPARATUS AND SIGNAL PROCESSING METHOD

BACKGROUND OF THE INVENTION

1. Field of the Invention

This invention relates to an image pickup apparatus including a solid-state image sensing device having a large number of pixels.

2. Background Art

In recent years, various image pickup apparatus capable of picking up an image in a wide dynamic range have been proposed (For example, refer to JP-A-2004-048445 (the term "JP-A" as used herein means an "unexamined published Japanese patent application")). JP-A-2004-048445 discloses the following image synthesis method: a high sensitive image and a low sensitive image less different in time and space are acquired using a solid-state image sensing device wherein each light reception cell is divided into a high sensitive light reception area and a low sensitive light reception area, an image quality degradation area of white splattering, black batter, etc., is automatically determined from one of the two images, the corresponding area is cut out from the other image in accordance with information of the image quality degradation area, and the cut-off image portion is combined with the portion of the image quality degradation area. Then, low-pass filtering is performed about all area of the composite image or the nearby area of the combined boundary for making the image smooth and then edge enhancement processing is performed.

In the method in the related art described above, a picked-up image based on the low sensitive light reception cells and a picked-up image based on the high sensitive light reception cells are partially cut and pasted to form one wide dynamic range composite image. However, since the low sensitive light reception cell has S/N ratio lowered relative to the high sensitive light reception cell, if they are partially combined into one, an unnatural image results. Although the low sensitive light reception cell and the high sensitive light reception cell are close to each other, they are placed at different positions and thus the picked-up image based on the low sensitive light reception cells and the picked-up image based on the high sensitive light reception cells differ slightly in time and space and an unnatural image results.

Processing of replacing an image quality degradation area of one image with an area of the other image corresponding to the image quality degradation area is performed, whereby it is made possible to correct white splattering, batter, etc. However, if output of the high sensitive light reception cell and output of the low sensitive light reception cell are saturated, such correction becomes difficult to execute.

SUMMARY OF THE INVENTION

It is therefore an object of the invention to provide an image pickup apparatus capable of faithfully and reliably reproducing a subject image.

(1) According to a first aspect of the present invention, an image pickup apparatus includes: a solid-state image sensing device that includes a plurality of pixels, each of the pixels including: a photoelectric conversion film that is formed above a semiconductor substrate for absorbing light in a specific wave range and generating a charge responsive thereto; and a photoelectric conversion element that is formed in the semiconductor substrate below the photoelectric conversion film, are made up of at least three types of photoelectric conversion elements for detecting light in different wave ranges, of visible light, and absorbs light in a wave range different from the wave ranges detected in the at least three types of photoelectric conversion elements and generates a charge responsive to the absorbed light; a monochrome image data generation unit that generates monochrome image data provided by providing pixel data corresponding to each pixel with color information obtained from the photoelectric conversion film from a first image pickup signal obtained from the photoelectric conversion film of the pixels; a color image data generation unit that generates color image data provided by providing pixel data corresponding to each pixel with three pieces of color information using at least a second image pickup signal obtained from the photoelectric conversion elements of the pixels, of the first image pickup signal obtained from the photoelectric conversion film of the pixels and the second image pickup signal; and a record image data generation unit that generates record image data using the monochrome image data and the color image data.

(2) The image pickup apparatus as described in the item (1), wherein the different types of photoelectric conversion elements are three types of photoelectric conversion elements for detecting light in different wave ranges, of visible light, the photoelectric conversion film absorbs light in an infrared wave range and generates a charge responsive to the absorbed light, and the color image data generation unit generates the color image data using the second image pickup signal.

(3) The image pickup apparatus as described in the item (1) or (2), wherein the different types of photoelectric conversion elements are three types of photoelectric conversion elements for detecting light in different wave ranges, of visible light, the photoelectric conversion film absorbs light in a wave range different from the wave ranges detected in the three types of photoelectric conversion elements, of visible light and generates a charge responsive to the absorbed light, and the color image data generation unit generates the color image data using the first image pickup signal and the second image pickup signal.

(4) The image pickup apparatus as described in any one of the items (1) to (3), wherein the record image data generation unit includes: a contour image data generation unit that extracts contour information from the monochrome image data to generate contour image data; and an image synthesis unit that combines the color image data and the contour image data into image data and outputting the image data as the record image data.

(5) The image pickup apparatus as described in the item (4), wherein, in a case where subject illumination is a level at which output from the photoelectric conversion element is not saturated, the image synthesis unit outputs the color image data as the record image data as it is and if subject illumination is a level at which output from the photoelectric conversion element is saturated, the image synthesis unit outputs the image data into which the color image data and the contour image data into image data are combined as the record image data.

(6) According to a second aspect of the present invention, an image pickup apparatus includes: a solid-state image sensing device that includes a plurality of pixels, each of the pixels including: a photoelectric conversion film that is formed above a semiconductor substrate for absorbing light in a specific wave range and generating a charge responsive thereto; and a photoelectric conversion element being formed in the semiconductor substrate below the photoelectric conversion film, are made up of two types of photoelectric conversion elements for detecting light in different wave ranges, of visible light, and absorbs light in a wave range different from the wave ranges detected in the two types of photoelectric conversion elements, of visible light and generates a charge responsive to the absorbed light; a monochrome image data generation unit that generates monochrome image data provided by providing pixel data corresponding to each pixel with color information obtained from the photoelectric conversion film from a first image pickup signal obtained from the photoelectric conversion film of the pixels; a color image data generation unit that generates color image data provided by providing pixel data corresponding to each pixel with three pieces of color information using the first image pickup signal obtained from the photoelectric conversion film of the pixels and a second image pickup signal obtained from the photoelectric conversion elements of the pixels; and a record image data generation unit that generates record image data using the monochrome image data and the color image data.

(7) The image pickup apparatus as described in the item (6), wherein the record image data generation unit includes: a contour image data generation unit that extracts contour information from the monochrome image data to generate contour image data; and an image synthesis unit that combines the color image data and the contour image data into image data and outputting the image data as the record image data.

(8) The image pickup apparatus as described in the item (7), wherein, in a case where subject illumination is a level at which output from the photoelectric conversion element is not saturated, the image synthesis unit outputs the color image data as the record image data as it is and if subject illumination is a level at which output from the photoelectric conversion element is saturated, the image synthesis unit outputs the image data into which the color image data and the contour image data into image data are combined as the record image data.

(9) The image pickup apparatus as described in any one of the items (1) to (8), further including: an exposure condition determination unit that determines an exposure condition of the photoelectric conversion element; and an application voltage adjustment unit that adjusts the voltage to be applied to the photoelectric conversion film so that the signals from the photoelectric conversion film contained in the pixels do not contain a signal exceeding a saturation level in image picking up under the exposure condition determined by the exposure condition determination unit, wherein an image is picked up based on the exposure condition in a state in which the voltage adjusted by the application voltage adjustment unit is applied to the photoelectric conversion film.

(10) According to a third aspect of the present invention, an image pickup apparatus includes: a solid-state image sensing device having a large number of pixels, each of the pixels including: a photoelectric conversion film that is formed above a semiconductor substrate for absorbing light in a specific wave range and generating a charge responsive thereto; and a photoelectric conversion element that is formed in the semiconductor substrate below the photoelectric conversion film; an exposure condition determination unit that determines an exposure condition of the photoelectric conversion element; and an application voltage adjustment unit that adjusts the voltage to be applied to the photoelectric conversion film so that the signals from the photoelectric conversion film contained in the pixels do not contain a signal exceeding a saturation level in image picking up under the exposure condition determined by the exposure condition determination unit, wherein an image is picked up based on the exposure condition in a state in which the voltage adjusted by the application voltage adjustment unit is applied to the photoelectric conversion film.

(11) The image pickup apparatus as described in the item (10), wherein the photoelectric conversion film absorbs light in an infrared wave range and generates a charge responsive to the absorbed light.

(12) According to a fourth aspect of the present invention, a signal processing method of processing a signal obtained from a solid-state image sensing device including a plurality of pixels, each of the pixels including: a photoelectric conversion film being formed above a semiconductor substrate for absorbing light in a specific wave range and generating a charge responsive thereto; and a photoelectric conversion element being formed in the semiconductor substrate below the photoelectric conversion film, are made up of at least three types of photoelectric conversion elements for detecting light in different wave ranges, of visible light, and absorbs light in a wave range different from the wave ranges detected in the at least three types of photoelectric conversion elements and generates a charge responsive to the absorbed light, the signal processing method including: generating monochrome image data that is provided by providing pixel data corresponding to each pixel with color information obtained from the photoelectric conversion film from a first image pickup signal obtained from the photoelectric conversion film of the pixels; generating color image data that is provided by providing pixel data corresponding to each pixel with three pieces of color information using at least a second image pickup signal obtained from the photoelectric conversion elements of the pixels, of the first image pickup signal obtained from the photoelectric conversion film of the pixels and the second image pickup signal; and generating record image data that uses the monochrome image data and the color image data.

(13) According to a fifth aspect of the present invention, a signal processing method of processing a signal obtained from a solid-state image sensing device including a plurality of pixels, each of the pixels including: a photoelectric conversion film being formed above a semiconductor substrate for absorbing light in a specific wave range and generating a charge responsive thereto; and a photoelectric conversion element being formed in the semiconductor substrate below the photoelectric conversion film, are made up of two types of photoelectric conversion elements for detecting light in different wave ranges, of visible light, and absorbs light in a wave range different from the wave ranges detected in the two types of photoelectric conversion elements, of visible light and generates a charge responsive to the absorbed light, the signal processing method including: generating monochrome image data that is provided by providing pixel data corresponding to each pixel with color information obtained from the photoelectric conversion film from a first image pickup signal obtained from the photoelectric conversion film of the pixels; generating color image data that is provided by providing pixel data corresponding to each pixel with three pieces of color information using the first image pickup signal obtained from the photoelectric conversion film of the pixels and a second image pickup signal obtained from the photoelectric conversion elements of the pixels; and generating record image data that uses the monochrome image data and the color image data.

(14) The signal processing method as described in the item (12) or (13), wherein the generating of record image data includes: extracting contour information from the monochrome image data to generate contour image data; and combining the color image data and the contour image data into image data and outputting the image data as the record image data.

According to the invention, there can be provided an image pickup apparatus capable of faithfully and reliably reproducing a subject image.

BRIEF DESCRIPTION OF THE DRAWINGS

The invention disclosed herein will be understood better with reference to the following drawings of which:

FIG. 5 is a drawing to show the relationship between an output signal (PD signal) from a photoelectric conversion element relative to subject illumination and an output signal (film signal) from an organic photoelectric conversion element in the solid-state image sensing device of the first embodiment of the invention;

FIG. 7 is a flowchart to describe the photographing operation of the digital camera of the first embodiment of the invention;

FIG. 13 is a detailed flowchart of step S13 shown in FIG. 12.

DETAILED DESCRIPTION OF THE INVENTION

Referring now to the accompanying drawing, there are shown embodiments of the invention. In the description that follows, light in the wave range of blue (B) of incident light (generally, about 380 nm to about 520 nm) is called B light; light in the wave range of green (G) (generally, about 450 nm to about 610 nm) is called G light; light in the wave range of red (R) (generally, about 550 nm to about 700 nm) is called R light; and light in the wave range of infrared (IR) (generally, about 680 nm to about 3000 nm) is called IR light.

First Embodiment

Figure 1:
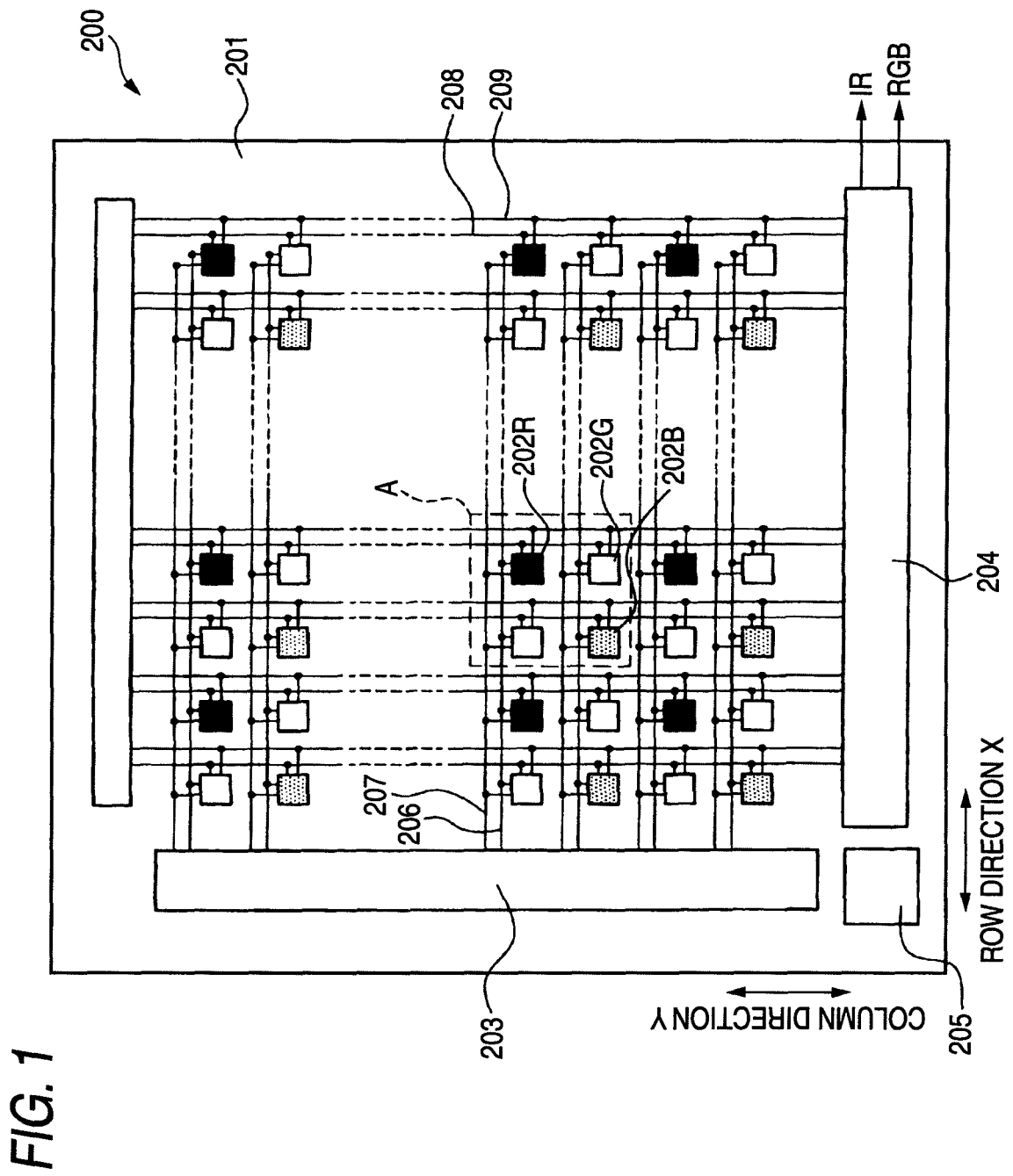
FIG. 1 is a plan schematic drawing to show the schematic configuration of a solid-state image sensing device of a first embodiment of the invention.

FIG. 1 is a plan schematic drawing to show the schematic configuration of a solid-state image sensing device of a first embodiment of the invention.

A solid-state image sensing device 200 shown in FIG. 1 includes three types of pixels of pixels 202R capable of outputting an R signal responsive to R light of incident light, pixels 202G capable of outputting a G signal responsive to G light of incident light, and pixels 202B capable of outputting a B signal responsive to B light of incident light, and the pixels are arranged two-dimensionally in a row direction X on a substrate 201 of silicon, etc., and a column direction Y orthogonal to the row direction X.

As shown in FIG. 1, the pixel array of the solid-state image sensing device 200 is an alternating pattern of a GR pixel row of a pixel row of an alternating pattern of pixels 202G and 202R in the row direction X and a BG pixel row of a pixel row of an alternating pattern of pixels 202B and 202G in the row direction X in the column direction Y. The pixel array of the solid-state image sensing device 200 is not limited to the pixel array shown in FIG. 1 and the pixels 202R, 202G, and 202B may be arranged like a vertical stripe or a horizontal stripe.

A row selection scanning section 203 is provided in a side part of the substrate 201 and an image signal processing section is provided in a lower side part. A control section 205 for generating a timing pulse to select a pixel and generating various control signals to drive a pixel is provided in an appropriate part of the substrate 201.

Provided above each pixel row are two signal lines of a reset signal line 206 and a row selection signal line 207 extending in the row direction X corresponding to the pixel row. The reset signal line 206 and the row selection signal line 207 are connected to the pixels of the pixel row corresponding to the signal lines and the row selection scanning section 203.

To the right of each pixel column made up of pixels arranged in the column direction Y, two signal lines of a column signal line 208 and a column signal line 209 are provided extending in the column direction Y corresponding to the pixel column. The column signal line 208 and the column signal line 209 are connected to the pixels of the pixel column corresponding to the signal lines and an image signal processing section 204.

Figure 2:
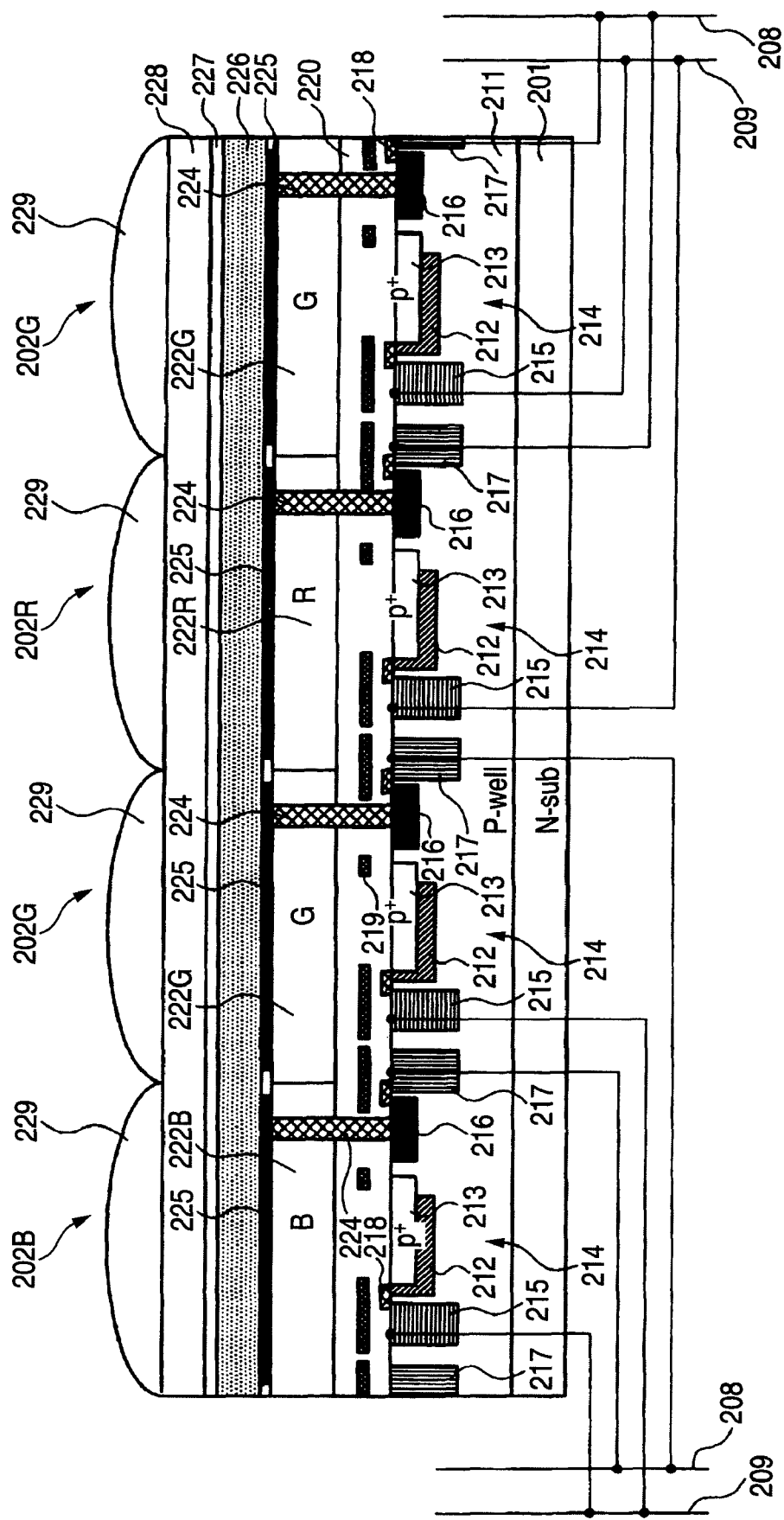
FIG. 2 is a drawing to illustrate a state in which cross sections of four pixels surrounded by dashed line (a) in FIG. 1 are combined into one.

FIG. 2 is a drawing to illustrate a state in which cross sections of four pixels surrounded by dashed line A in FIG. 1 are combined into one.

The substrate 201 is an n-type silicon substrate, for example, and a p well layer 211 is formed on the substrate. The substrate 201 and the p well layer 211 make up a semiconductor substrate. A insulating layer 220 transparent to incident light is formed on the p well layer 211. Formed on the insulating layer 220 is a color filter layer made up of a color filter 222R for transmitting R light of a component of the pixel 202R, a color filter 222G for transmitting G light of a component of the pixel 202G, and a color filter 222B for transmitting B light of a component of the pixel 202B. Pixel electrodes 225 made of transparent material (for example, ITO or thin metal film) to incident light, divided one for each pixel are formed on the color filter layer. A photoelectric conversion film 226 for absorbing IR light and generating a charge responsive to the IR light is formed on the pixel electrodes 225. A common electrode 227 made of transparent material (for example, ITO or thin metal film) to incident light is formed on the photoelectric conversion film 226. A protective layer 228 transparent to incident light is formed on the common electrode 227. The photoelectric conversion film 226, the common electrode 227, and the protective layer 228 are common to all pixels. A microlens 229 for gathering incident light into each pixel is formed at the position corresponding to the pixel on the protective layer 228.

The photoelectric conversion film 226 is formed of an organic photoelectric conversion material (for example, phthalocyanine-based organic material or naphthalocyanine-based organic material) for absorbing IR light and generating a charge responsive to the IR light and transmitting visible light. The photoelectric conversion film 226 may be formed of an inorganic material. If a predetermined bias voltage is applied to the pixel electrode 225 and the common electrode 227 and an electric field is applied to the photoelectric conversion film 226, a signal charge responsive to the light amount of incident IR light occurs on the photoelectric conversion film 226. The photoelectric conversion film 226 is formed by depositing the above-mentioned photoelectric conversion material on the pixel electrodes 225 according to a sputtering method, a laser ablation method, a print technology, a spray method, etc.

Each of the photoelectric conversion film 226 and the common electrode 227 may be divided into pieces in a one-to-one correspondence with the pixels. To divide the common electrode 227 into pieces in a one-to-one correspondence with the pixels, the provided common electrodes 227 may be connected to common wiring so that the same bias voltage can be applied to the common electrodes 227.

Each of the pixels 202R, 202G, and 202B is made up of a part of the p well layer 211, the color filter, the pixel electrode 225, a part of the photoelectric conversion film 226, a part of the common electrode 227, and the microlens 229. Each of the pixels 202R, 202G, and 202B has a common structure except for the color filter and therefore the common structure will be discussed with the pixel 202R as a representative.

The pixel electrode 225 is formed on the color filter 222R of the pixel 202R. The pixel electrode 225, the common electrode 227 opposed to the pixel electrode 225, and the photoelectric conversion film 226 sandwiched therebetween make up an organic photoelectric conversion element for detecting IR light.

The p well layer 211 of the pixel 202R is formed with an n-type impurity layer (which will be hereinafter referred to as n layer) 212 formed from the surface of the p well layer 211 to the inside. A p-type impurity layer (which will be hereinafter referred to as p layer) 213 for suppressing a dark current with a higher impurity concentration than that of the n layer 212 is formed from the surface of the n layer 212 to the inside. The p well layer 211, the n layer 212, and the p layer 213 make up a photodiode (PD) 214 of a photoelectric conversion element. A charge occurring in the photodiode 214 is stored in the n layer 212.

A signal read circuit 215 is formed at a small distance to the left of the photodiode 214. The signal read circuit 215 uses a transistor circuit of a three-transistor configuration, a four-transistor configuration, etc., used with an existing CMOS type image sensor, for example. Each of the row selection scanning section 203 and the image signal processing section 204 can also use the same as used with an existing CMOS type image sensor.

Output of the signal read circuit 215 is connected to the column signal line 209. The signal read circuit 215 is also connected to the row selection signal line 207 and if a pulse is applied therefrom, a voltage signal responsive to the charge stored in the n layer 212 is output to the column signal line 209. The signal read circuit 215 is also connected to the reset signal line 206 and if a pulse is applied therefrom, the reset operation of sweeping out the charge stored in the n layer 212 to a rest drain is performed.

A charge storage part 216, for example, made of an n layer for storing a charge occurring in the photoelectric conversion film 226 of the organic photoelectric conversion element of the pixel 202R is formed from the surface to the inside at a small distance to the right of the photodiode 214. A signal read circuit 217 is formed at a small distance to the right of the charge storage part 216.

The signal read circuit 217 can use a transistor circuit of a three-transistor configuration, a four-transistor configuration, etc., used with an existing CMOS type image sensor, for example.

Output of the signal read circuit 217 is connected to the column signal line 208. The signal read circuit 217 is also connected to the row selection signal line 207 and if a pulse is applied therefrom, a voltage signal responsive to the charge stored in the charge storage part 216 is output to the column signal line 208. The signal read circuit 217 is also connected to the reset signal line 206 and if a pulse is applied therefrom, the reset operation of sweeping out the charge stored in the charge storage part 216 to the rest drain is performed.

Each of the signal read circuits 215 and 217 may adopt a structure for transferring a signal charge detected in each pixel to an amplifier over a charge transfer passage (vertical charge transfer passage VCCD, horizontal charge transfer passage HCCD) and outputting a signal in the amplifier as with an already existing CCD (charge coupled device) type solid-state image sensing device.

In an inorganic layer 220 on the charge storage part 216 and the color filter 222R above the charge storage part 216, a contact part 224 is formed through to the pixel electrode 225. The contact part 224 is directly connected to the pixel electrode 225 and the charge storage part 216 and functions as connection means for electrically connecting them.

A poly-wiring layer 218 and a three-layer metal wiring layer 219 are provided in the insulating layer 220. The number of the wiring layers is determined by the number of wiring lines required for the circuit operation of the signal read circuit 215, 217. The three-layer metal wiring layer 219 also functions as a light shield film for shielding the signal read circuit 215, 217. The top face of the insulating layer 220 is flattened and the color filter layer is formed thereon.

The structure described so far is the structure common to the pixels. Next, structure portions varying from one type of pixel to another will be discussed.

Formed above the photodiode 214 of the pixel 202R is the color filter 222R corresponding to the photodiode 214. Formed above the photodiode 214 of the pixel 202G is the color filter 222G corresponding to the photodiode 214. Formed above the photodiode 214 of the pixel 202B is the color filter 222B corresponding to the photodiode 214.

According to the configuration, the photodiode 214 of the pixel 202R functions as a first photoelectric conversion element for detecting R light, the photodiode 214 of the pixel 202G functions as a second photoelectric conversion element for detecting G light, and the photodiode 214 of the pixel 202B functions as a third photoelectric conversion element for detecting B light. Thus, each pixel of the solid-state image sensing device 200 contains the organic photoelectric conversion element and the photodiode 214.

Next, the operation of the described solid-state image sensing device 200 is as follows:

When light is incident on the solid-state image sensing device 200, the pixel 202R absorbs IR light of the incident light in the photoelectric conversion film 226 and allows R light, G light, B light, and ultraviolet light to pass through the photoelectric conversion film 226. The R light of the passing-through light passes through the color filter 222R and is absorbed in the photodiode 214.

The pixel 202G absorbs IR light of the incident light in the photoelectric conversion film 226 and allows R light, G light, B light, and ultraviolet light to pass through the photoelectric conversion film 226. The G light of the passing-through light passes through the color filter 222G and is absorbed in the photodiode 214.

The pixel 202B absorbs IR light of the incident light in the photoelectric conversion film 226 and allows R light, G light, B light, and ultraviolet light to pass through the photoelectric conversion film 226. The B light of the passing-through light passes through the color filter 222B and is absorbed in the photodiode 214.

A signal charge responsive to the light amount of the incident IR light occurs in the photoelectric conversion film 226 of the pixel 202R. The signal charge occurring in the photoelectric conversion film 226 of the pixel 202R is collected in the pixel electrode 225 of the pixel 202R, passes through the contact part 224 of the pixel 202R, and is converted into a signal in the signal read circuit 217 of the pixel 202R, and the signal is output to the column signal line 208 as an IR signal.

A signal charge responsive to the light amount of the incident IR light occurs in the photoelectric conversion film 226 of the pixel 202G. The signal charge occurring in the photoelectric conversion film 226 of the pixel 202G is collected in the pixel electrode 225 of the pixel 202G, passes through the contact part 224 of the pixel 202G, and is converted into a signal in the signal read circuit 217, and the signal is output to the column signal line 208 as an IR signal.

A signal charge responsive to the light amount of the incident IR light occurs in the photoelectric conversion film 226 of the pixel 202B. The signal charge occurring in the photoelectric conversion film 226 of the pixel 202B is collected in the pixel electrode 225 of the pixel 202B, passes through the contact part 224 of the pixel 202B, and is converted into a signal in the signal read circuit 217 of the pixel 202B, and the signal is output to the column signal line 208 as an IR signal.

The IR signals provided from the pixels 202R, 202G, and 202B, output from the column signal line 208 are processed, whereby infrared image data made up of as many pixel data pieces as the total number of the pixels of the solid-state image sensing device 200 (data provided by providing pixel data corresponding to each pixel with an IR signal) can be generated.

An R signal charge responsive to the light amount of the incident R light occurs in the photodiode 214 of the pixel 202R. An R signal responsive to the R signal charge is output from the signal read circuit 215 of the pixel 202R to the row signal line 209.

A G signal charge responsive to the light amount of the incident G light occurs in the photodiode 214 of the pixel 202G. A G signal responsive to the G signal charge is output from the signal read circuit 215 of the pixel 202G to the row signal line 209.

A B signal charge responsive to the light amount of the incident B light occurs in the photodiode 214 of the pixel 202B. A G signal responsive to the B signal charge is output from the signal read circuit 215 of the pixel 202B to the row signal line 209.

The R, G, and B signals thus output can be used to generate RGB color image data provided by providing pixel data corresponding to each pixel with three color information pieces of R, G, and B.

According to the technique described above, it is made possible to provide RGB color image data and infrared image data by one image picking up.

Figure 3:
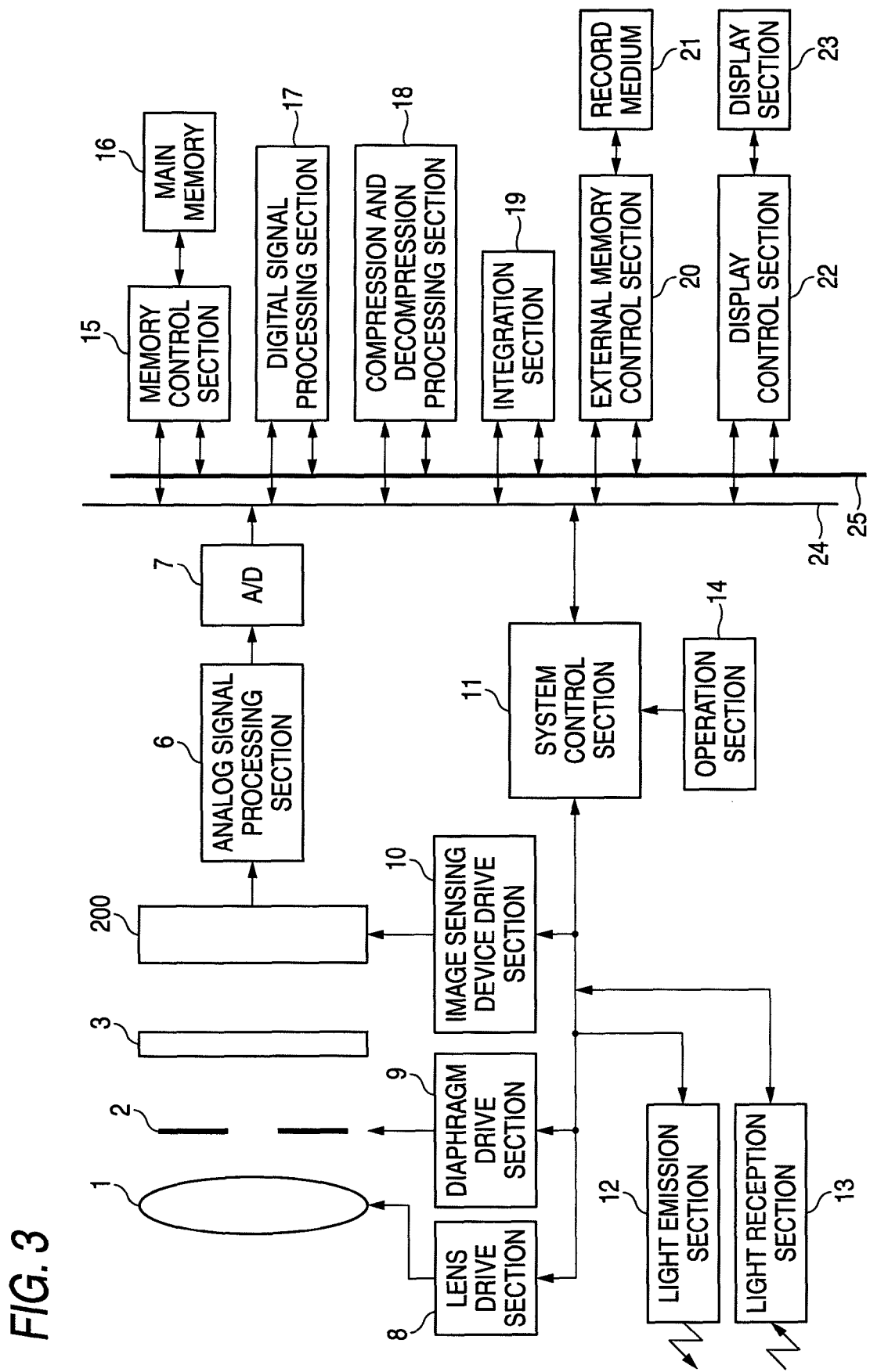
FIG. 3 is a drawing to show the schematic configuration of a digital camera of an example of an image pickup apparatus installing the solid-state image sensing device shown in FIG. 1.

The described solid-state image sensing device 200 can be installed in an image pickup apparatus such as a digital camera or a digital video camera for use. The configuration of a digital camera of an example of an image pickup apparatus installing the solid-state image sensing device 200 will be discussed below:

FIG. 3 is a drawing to show the schematic configuration of a digital camera of an example of an image pickup apparatus installing the solid-state image sensing device 200 shown in FIG. 1.

An image pickup system of the digital camera shown in the figure includes a taking lens 1, the above-described solid-state image sensing device 200, a diaphragm 2 placed therebetween, and an optical low-pass filter 4.

A system control section 11 for controlling the whole electric control system of the digital camera controls a flash light emission section 12 and a light reception section 13, controls a lens drive section 8 for adjusting the position of the taking lens 1 to a focus position and making zoom adjustment, and controls the aperture of the diaphragm 2 through a diaphragm drive section 9 for making exposure value adjustment.

The system control section 11 also drives the solid-state image sensing device 200 through an image sensing device drive section 10 for outputting a subject image picked up through the taking lens 1 as a color signal. A command signal from the user is input through an operation section 14 to the system control section 11.

The electric control system of the digital camera further includes an analog signal processing section 6 for performing analog signal processing of correlated double sampling, etc., connected to output of the solid-state image sensing device 200 and an A/D conversion circuit 7 for converting a signal output from the analog signal processing section 6 into a digital signal, and the analog signal processing section 6 and the A/D conversion circuit 7 are controlled by the system control section 11.

The electric control system of the digital camera further includes main memory 16, a memory control section 15 connected to the main memory 16, a digital signal processing section 17 for performing various types of signal processing of interpolation computation, gamma correction computation, etc., to generate record image data, a compression and decompression section 18 for compressing the image data generated in the digital signal processing section 17 into a JPEG format and decompressing the compressed image data, an integration section 19 for integrating photometric data and finding a gain of white balance correction performed by the digital signal processing section 17, an external memory control section 20 to which a detachable record medium 23 is connected, and a display control section 22 to which a liquid crystal display section 23 installed on the rear of the camera, etc., is connected; they are connected by a control bus 24 and a data bus 25 and are controlled by a command from the system control section 11.

Figure 4:
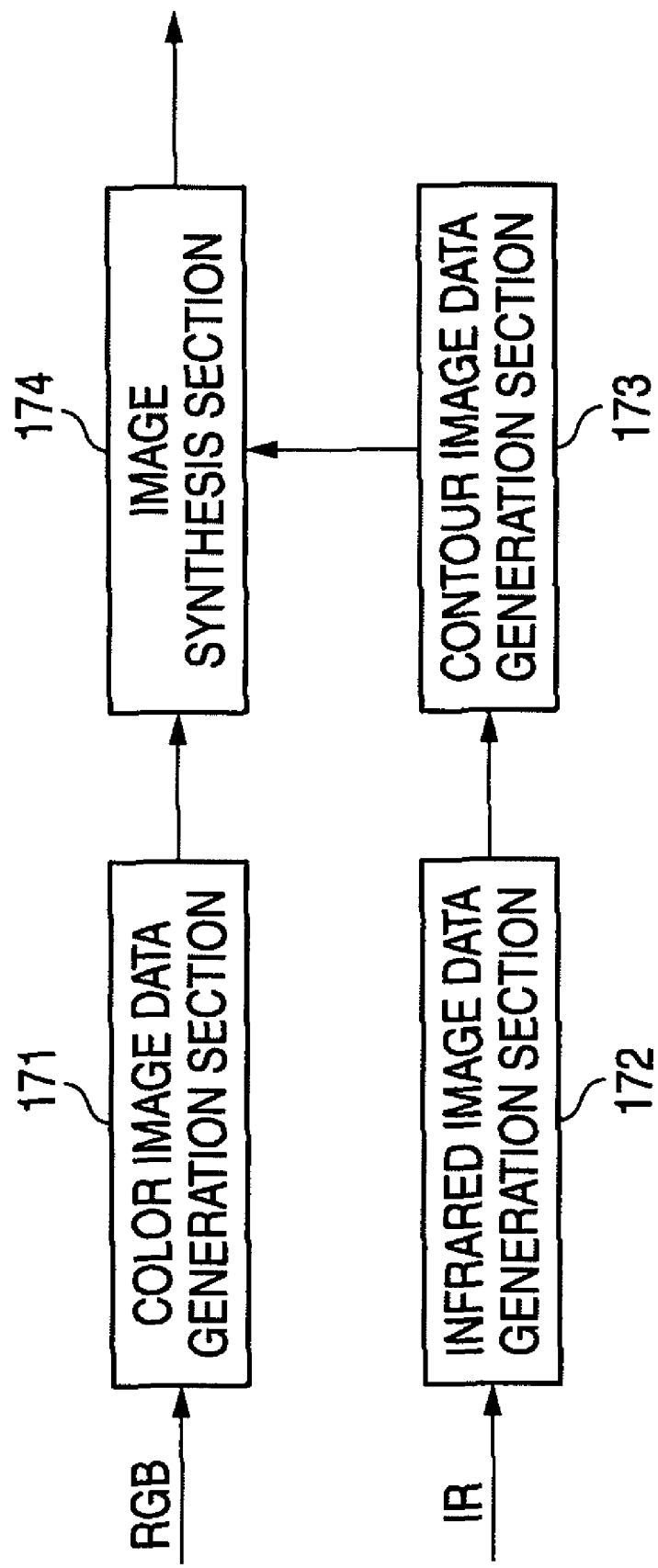
FIG. 4 is a block diagram to show the detailed configuration of a digital signal processing section shown in FIG. 3.

FIG. 4 is a block diagram to show the detailed configuration of the digital signal processing section 17 shown in FIG. 3.

The digital signal processing section 17 includes a color image data generation section 171, an infrared image data generation section 172, a contour image data generation section 173, and an image synthesis section 174. The functions of these blocks are implemented as the digital signal processing section 17 executes a predetermined program.

The color image data generation section 171 generates color image data provided by providing one pixel data piece with color signals of R, G and B from the R, G, and B signals obtained from the photodiodes 214 of the pixels of the solid-state image sensing device 200. Specifically, the color image data generation section 171 performs synchronization processing of interpolating other color signals not obtained from the photodiode 214 of each pixel into the pixel position corresponding to the pixel of the solid-state image sensing device 200 to generate three color signals of R, G, and B at the pixel position and generates color image data made up of as many pixel data pieces as the total number of the pixels of the solid-state image sensing device 200 with the three color signals as the pixel data corresponding to the pixel position. For example, R signal exists, but G and B signals do not exist at the pixel position corresponding to the pixel 202R and thus at this pixel position, G and B signals are interpolated using the G and B signals at the surrounding pixel positions and three color signals of R, G, and B are generated at the pixel position corresponding to the pixel 202R.

The infrared image data generation section 172 generates infrared image data provided by providing one pixel data piece with an IR signal from the IR signal obtained from the organic photoelectric conversion element of each pixel of the solid-state image sensing device 200. Specifically, the infrared image data generation section 172 places the IR signal obtained from the organic photoelectric conversion element of each pixel at the pixel position corresponding to the pixel of the solid-state image sensing device 200 and generates infrared image data made up of as many pixel data pieces as the total number of the pixels of the solid-state image sensing device 200 with the IR signal as the pixel data corresponding to the pixel position.

The contour image data generation section 173 extracts only contour information from the infrared image data generated in the infrared image data generation section 172 to generate contour image data. How to extract the contour information is known and therefore will not be discussed here.

The image synthesis section 174 combines the color image data generated in the color image data generation section 171 and the contour image data generated in the contour image data generation section 173 to generate record image data on a record medium 21 and outputs the image data to the compression and decompression section 18.

FIG. 5 is a drawing to show the relationship between an output signal (PD signal) from the photoelectric conversion element 214 relative to subject illumination and an output signal (film signal) from the organic photoelectric conversion element.

The organic photoelectric conversion element has a larger light reception area than the photoelectric conversion element 214 and thus involves a dynamic range larger than that of the photoelectric conversion element 214. That is, if a subject contains a high-illumination area where an output signal is saturated and white splattering occurs, the organic photoelectric conversion element makes it possible to pick up the high-illumination area without causing white splattering to occur.

Figure 6C:
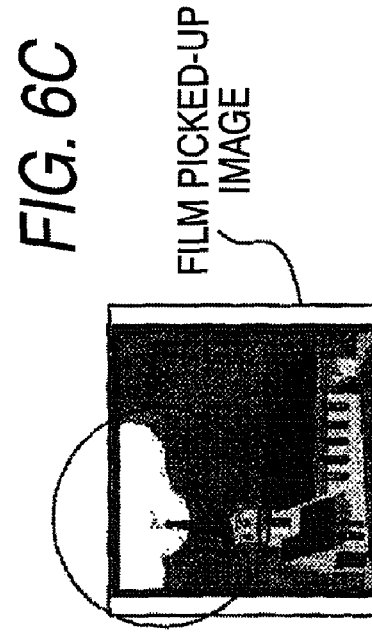
FIGS. 6A to 6E are drawings to describe image synthesis processing.
Figure 6D:
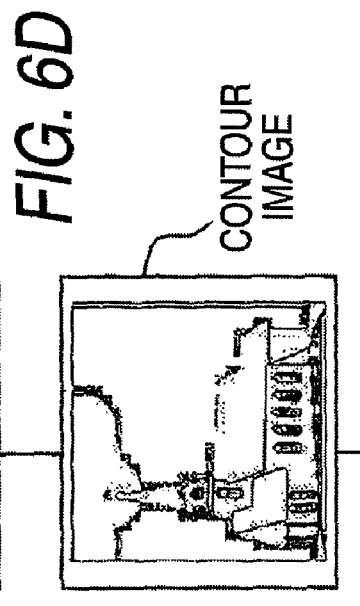
Figure 6A:
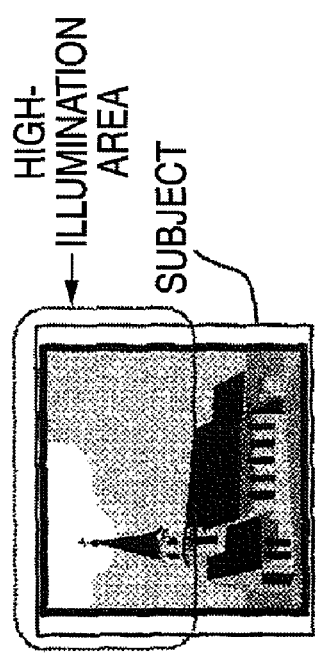
Figure 6B:
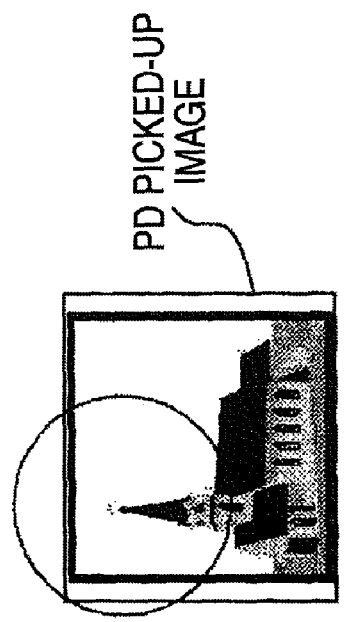

For example, the case where a building with a blue sky containing a cloud as a background as shown in FIG. 6A is picked up is considered. In the subject, it is assumed that the cloud and blue sky area is a high-illumination area of an illumination level at which an output signal from the photoelectric conversion element 214 is saturated. If such a subject is photographed with the digital camera of the embodiment, the color image data generated in the color image data generation section 171 becomes color image data with white splattering occurring in the high-illumination area where the contours (edges) of the cloud disappears as shown in FIG. 6B. In contrast, the infrared image data generated in the infrared image data generation section 172 becomes color image data with no white splattering occurring in the high-illumination area as shown in FIG. 6C.

Figure 6E:
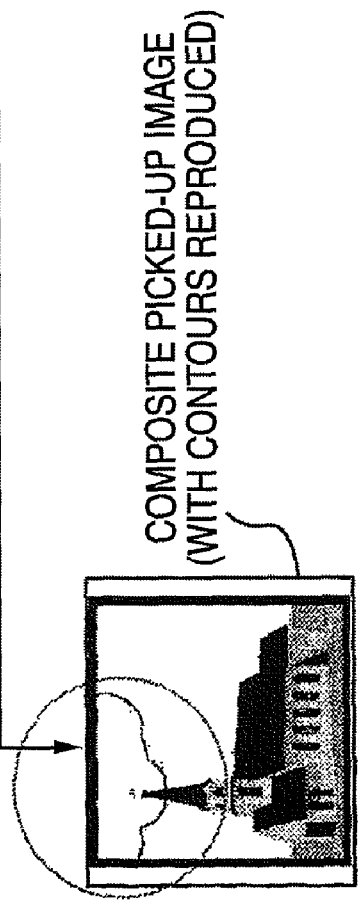

In the digital camera of the embodiment, the contour image data generation section 173 extracts contour information from the infrared image data shown in FIG. 6C to generate contour image data shown in FIG. 6D and the image synthesis section 174 combines the contour image data shown in FIG. 6D and the color image data shown in FIG. 6B to generate composite image data as shown in FIG. 6E. The contours of the cloud remain in the contour image data shown in FIG. 6D and thus are combined with the color image data shown in FIG. 6B, whereby it is made possible to reproduce the contours of the cloud once disappearing because of white splattering in the high-illumination area in FIG. 6B.

Next, the operation of the digital camera is as follows: FIG. 7 is a flowchart to describe the photographing operation of the digital camera of the embodiment of the invention.

When a photographing command is given, an electronic shutter of the photoelectric conversion element 214 is "opened," a predetermined bias voltage is applied to the pixel electrode 225 and the common electrode 227, and picking up of a subject is started at the same time with the photoelectric conversion element 214 and the organic photoelectric conversion element under the control of the image sensing device drive section 10 (steps S1 and S3). At the expiration of the exposure time period, color image data is generated from the R, G, and B signals obtained from the photoelectric conversion element 214 (step S2). Further, IR image data is generated from the IR signal obtained from the organic photoelectric conversion element and contour information is extracted from the IR image data to generate contour image data (step S4). Steps S2 and S4 may be executed at the same time or may be executed at different timings.

After steps S2 and S4, the color image data and the contour image data are combined (step S5) and color image data for record medium record faithfully reproducing the contours of the subject is output (step S6) and is compressed and then the compressed data is recorded on a record medium 21.

As described above, the digital camera of the embodiment combines the contour image data representing the contours of the subject generated according to the signal obtained from the organic photoelectric conversion element involving a wide dynamic range with the color image data generated according to the signal obtained from the photoelectric conversion element 214 involving a narrow dynamic range to generate record image data on the record medium 21. Thus, if the subject contains a high-illumination area where white splattering will occur only with the photoelectric conversion element 214, image data faithfully reproducing the contours of the subject in the high-illumination area can be provided.

In the digital camera of the embodiment, the photoelectric conversion film of the solid-state image sensing device 200 is formed of a photoelectric conversion material for absorbing IR light and generating a charge responsive to the IR light. Thus, even in photographing in the dark, image data faithfully reproducing the contours of a building in the dark can be provided. The digital camera of the embodiment can provide image data faithfully reproducing the contours of a subject regardless of the subject (too light subject or too dark subject) and thus is suited for a system wherein it is important for the camera to be able to detect the motion of a subject under all conditions, such as a surveillance camera.

The organic photoelectric conversion material forming the photoelectric conversion film 226 of the solid-state image sensing device 200 involves a short mean free path of infrared light as compared with silicon and thus can provide infrared image data with a small pixel-to-pixel stroke, namely, high-resolution infrared image data as compared with infrared image picking up with silicon. The infrared image data becomes a high resolution, so that the extraction accuracy of contours improves and the reproducibility of contours improves and thus preferably the photoelectric conversion film 226 is formed of an organic photoelectric conversion material rather than an inorganic photoelectric conversion material.

The solid-state image sensing device 200 has a structure wherein the photoelectric conversion element 214 and the organic photoelectric conversion element are deposited at the same position, so that the color image data generated in the color image data generation section 171 and the infrared image data generated in the infrared image data generation section 172 can be made not different in time and space. Since the whole color image data and the whole contour image data generated from the infrared image data which is not different from the color image data in time and space are combined to generate record image data, an image based on the record image data can be made more agreeable.

In the description of the embodiment, a large number of photoelectric conversion elements 214 contained in the solid-state image sensing device 200 are made up of the three types of photoelectric conversion elements of those for detecting R light, those for detecting G light, and those for detecting B light, but the invention is not limited to the mode; a large number of photoelectric conversion elements 214 may be made up of four or more types of photoelectric conversion elements.

The photoelectric conversion material forming the photoelectric conversion film 226 is not limited to the material for absorbing IR light and generating a charge responsive to the IR light and may be any if it is a material capable of generating contour image data from the signal obtained from the photoelectric conversion film 226. However, if a material for absorbing light to be absorbed in the photoelectric conversion element 214 is adopted, light is not incident on the photoelectric conversion element 214 and thus it is desirable that a material for allowing light to be absorbed in the photoelectric conversion element 214 to pass through should be adopted.

In the embodiment, the image synthesis section 174 always outputs composite image data into which the color image data and the contour image data are combined as record image data, but the digital signal processing section 17 can also be provided with means for determining whether or not the signal from the photoelectric conversion element 214 reaches the saturation level to change the output data in response to the determination result of the mean. In this case, if the signal from the photoelectric conversion element 214 does not reach the saturation level, the image synthesis section 174 may output the color image data generated in the color image data generation section 171 as record image data as it is; if the signal from the photoelectric conversion element 214 reaches the saturation level, the image synthesis section 174 may output composite image data into which the color image data generated in the color image data generation section 171 and the contour image data are combined as record image data.

Second Embodiment

The general configuration of a digital camera described in a second embodiment of the invention is almost the same as that shown in FIG. 3 except the configurations of solid-state image sensing device 200 and digital signal processing section 17.

A solid-state image sensing device 200 of the digital camera of the second embodiment uses a photoelectric conversion material for absorbing light in a wave range of a part of G light (about 480 nm to about 520 nm) (which will be hereinafter referred to as emerald (E) light) and generating a charge responsive to the E light as a photoelectric conversion film 226. According to the configuration, E image data containing only an E component can be generated using an output signal of an organic photoelectric conversion element and RGB color image data improved in color reproducibility can be generated using an output signal of a photoelectric conversion element 214 and the output signal of the organic photoelectric conversion element.

Figure 8:
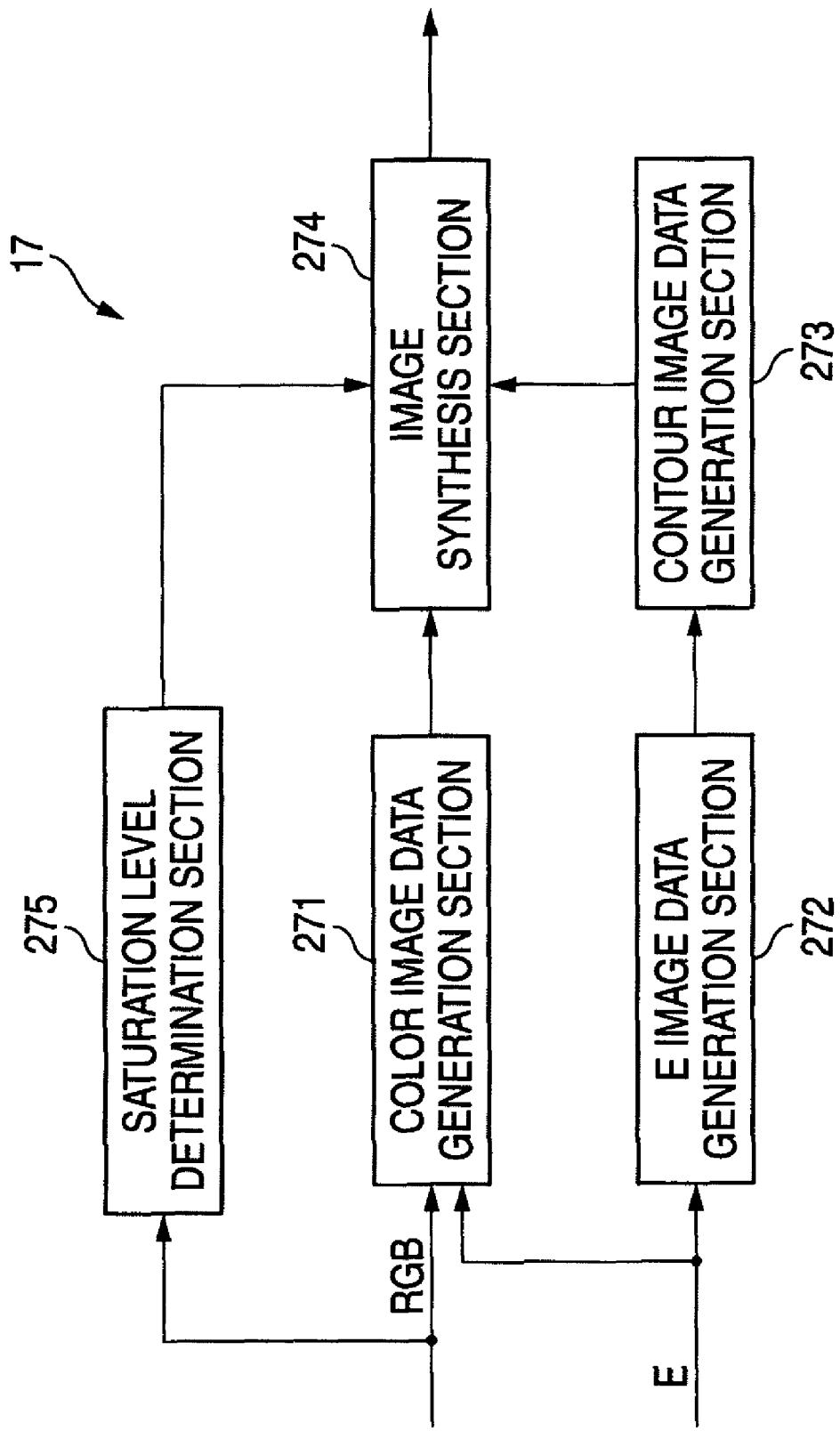
FIG. 8 is a block diagram to show the detailed configuration of a digital signal processing section of a digital camera of a second embodiment of the invention.

FIG. 8 is a block diagram to show the detailed configuration of a digital signal processing section of the digital camera of the second embodiment of the invention.

A digital signal processing section 17 shown in FIG. 8 includes a color image data generation section 271, an E image data generation section 272, a contour image data generation section 273, an image synthesis section 274, and a saturation level determination section 275.

The color image data generation section 271 generates color image data provided by providing one pixel data piece with color signals of R, G and B from the R, G, and B signals obtained from photodiodes 214 of pixels of the solid-state image sensing device 200 and E signal obtained from the photoelectric conversion film 226. Specifically, the color image data generation section 271 performs synchronization processing of interpolating other color signals not obtained from the photodiode 214 of each pixel into the pixel position corresponding to the pixel of the solid-state image sensing device 200 to generate four color signals of R, G, B, and E at the pixel position and uses the E signal to correct the visual sensitivity characteristic to the R signal of the four color signals. Then, the color image data generation section 271 generates color image data made up of as many pixel data pieces as the total number of the pixels of the solid-state image sensing device 200 with the three color signals of the post-corrected R signal, the G signal, and the B signal as the pixel data corresponding to the pixel position.

The advantage of detecting emerald light in the wave range of 480 to 520 nm is to correct red light in response to the visual sensitivity of a human being. For the visual sensitivity of a human being, if only positive sensitivity to R, G, and B is detected in the photoelectric conversion elements 214 of the solid-state image sensing device 200 and color reproduction is executed, an image viewed by a human being cannot be reproduced. Then, the negative sensitivity to red, the largest negative sensitivity, is detected using an emerald film and signal processing of subtracting the negative sensitivity component from the sensitivity to red detected in the photoelectric conversion elements 214 is performed in a similar manner to signal processing described in Japanese Patent No. 2872759, so that the human being's sensitivity to red can be reproduced and color reproducibility can be improved.

The E image data generation section 272 generates E image data provided by providing one pixel data piece with an E signal from the E signal obtained from the organic photoelectric conversion element of each pixel of the solid-state image sensing device 200. Specifically, the E image data generation section 272 places the E signal obtained from the organic photoelectric conversion element of each pixel at the pixel position corresponding to the pixel of the solid-state image sensing device 200 and generates E image data made up of as many pixel data pieces as the total number of the pixels of the solid-state image sensing device 200 with the E signal as the pixel data corresponding to the pixel position.

The contour image data generation section 273 extracts only contour information from the E image data generated in the E image data generation section 272 to generate contour image data. How to extract the contour information is known and therefore will not be discussed here.

The saturation level determination section 275 determines whether or not any of the R, G, or B signal obtained from the photoelectric conversion elements 214 reaches a saturation level, and sends the determination result to the image synthesis section 274.

If none of the R, G, and B signals obtained from the photoelectric conversion elements 214 does not reach the saturation level, namely, if the subject illumination is a level at which output from the photoelectric conversion elements 214 is not saturated, the image synthesis section 274 outputs the color image data generated in the color image data generation section 271 as record image data as it is. On the other hand, if any of the R, G, or B signal obtained from the photoelectric conversion elements 214 reaches the saturation level, namely, if the subject illumination is a level at which output from the photoelectric conversion elements 214 is saturated, the image synthesis section 274 combines the color image data generated in the color image data generation section 271 and the contour image data generated in the contour image data generation section 273 to generate record image data and outputs the record image data.

Next, the operation of the digital camera is as follows:

When a photographing command is given, an electronic shutter of the photoelectric conversion element 214 is "opened," a predetermined bias voltage is applied to a pixel electrode 225 and a common electrode 227, and picking up of a subject is started at the same time with the photoelectric conversion element 214 and the organic photoelectric conversion element under the control of an image sensing device drive section 10. At the expiration of the exposure time period, color image data is generated from the R, G, and B signals obtained from the photoelectric conversion elements 214 and the E signal obtained from the organic photoelectric conversion element.

Next, whether or not any of the R, G, or B signal obtained from the photoelectric conversion elements 214 reaches the saturation level is determined and if none of the R, G, and B signals does not reach the saturation level, the generated color image data is output as record image data. On the other hand, if any of the R, G, or B signal reaches the saturation level, E image data is generated from the E signal obtained from the organic photoelectric conversion element and contour image data is generated from the E image data. The contour image data and the color image data are combined into record image data and this record image data is output. The record image data is compressed and then the compressed data is recorded on a record medium 21.

As described above, according to the digital camera of the embodiment, if the subject illumination is a level at which output from the photoelectric conversion elements 214 is not saturated, the color image data with color reproducibility improved can be generated using the R, G, and B signals and the E signal and can be output as record image data; if the subject illumination is a level at which output from the photoelectric conversion elements 214 is saturated, the image data into which the color image data with color reproducibility improved and the contour image data are combined can be output as record image data. Thus, if the subject illumination is low and white splattering, etc., does not occur, the color image data with high color reproducibility can be provided; if the subject illumination is high and white splattering occurs, the color image data with high color reproducibility and faithfully reproducing the contours of the subject can be provided.

The saturation level determination section 275 shown in FIG. 8 may be omitted so that the image synthesis section 274 always outputs the image data into which the color image data and the contour image data are combined as record image data.

Third Embodiment

The general configuration of a digital camera described in a third embodiment of the invention is almost the same as that shown in FIG. 3 except the configurations of solid-state image sensing device 200 and digital signal processing section 17.

The solid-state image sensing device 200 of the digital camera of the third embodiment has a configuration wherein the pixels 202G of the GR pixel row shown in FIG. 1 are changed to pixels 202B, the pixels 202G of the BG pixel row shown in FIG. 1 are changed to pixels 202R, and a photoelectric conversion material for absorbing G light and generating a charge responsive to the G light is used as a photoelectric conversion film 226. According to the configuration, monochrome image data containing only a G component can be generated using an output signal of an organic photoelectric conversion element and RGB color image data can be generated using an output signal of a photoelectric conversion element 214 and the output signal of the organic photoelectric conversion element.

Figure 9:
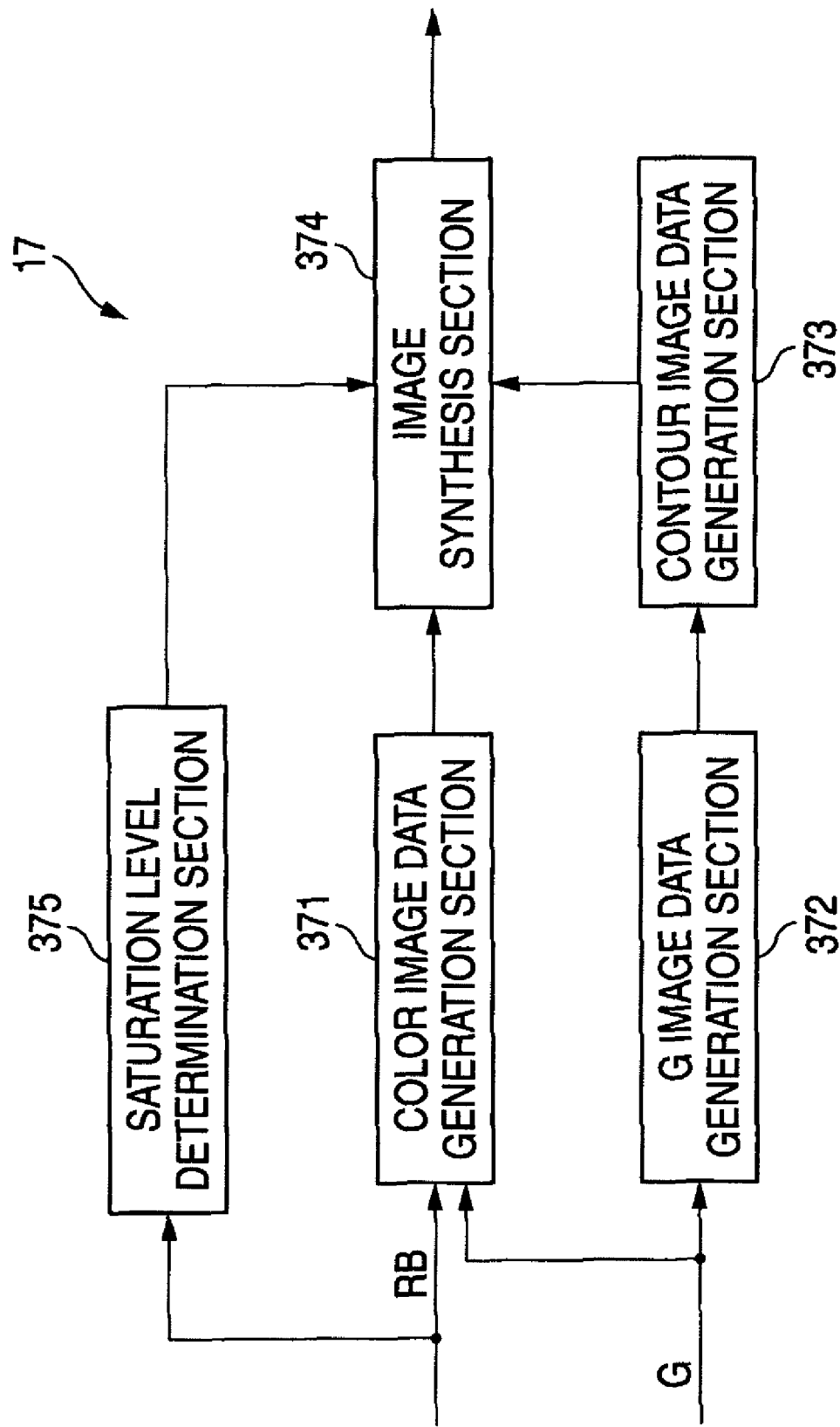
FIG. 9 is a block diagram to show the detailed configuration of a digital signal processing section of a digital camera of a third embodiment of the invention.

FIG. 9 is a block diagram to show the detailed configuration of a digital signal processing section of the digital camera of the third embodiment of the invention.

A digital signal processing section 17 shown in FIG. 9 includes a color image data generation section 371, a G image data generation section 372, a contour image data generation section 373, an image synthesis section 374, and a saturation level determination section 375.

The color image data generation section 371 generates color image data provided by providing one pixel data piece with color signals of R, G and B from the R and B signals obtained from photodiodes 214 of pixels of the solid-state image sensing device 200 and G signal obtained from the photoelectric conversion film 226. Specifically, the color image data generation section 371 performs synchronization processing of interpolating other color signals not obtained from the photodiode 214 of each pixel into the pixel position corresponding to the pixel of the solid-state image sensing device 200 to generate three color signals of R, G, and B at the pixel position and generates color image data made up of as many pixel data pieces as the total number of the pixels of the solid-state image sensing device 200 with the three color signals as the pixel data corresponding to the pixel position. For example, R and G signals exist, but B signal does not exist at the pixel position corresponding to the pixel 202R and thus at this pixel position, B signal is interpolated using the B signal at the surrounding pixel position and three color signals of R, G, and B are generated at the pixel position corresponding to the pixel 202R.

The G image data generation section 372 generates G image data provided by providing one pixel data piece with a G signal from the G signal obtained from the organic photoelectric conversion element of each pixel of the solid-state image sensing device 200. Specifically, the G image data generation section 372 places the G signal obtained from the organic photoelectric conversion element of each pixel at the pixel position corresponding to the pixel of the solid-state image sensing device 200 and generates G image data made up of as many pixel data pieces as the total number of the pixels of the solid-state image sensing device 200 with the G signal as the pixel data corresponding to the pixel position.

The contour image data generation section 373 extracts only contour information from the G image data generated in the G image data generation section 372 to generate contour image data. How to extract the contour information is known and therefore will not be discussed here.

The saturation level determination section 375 determines whether or not any of the R signals or B signals obtained from the photoelectric conversion elements 214 reaches a saturation level, and sends the determination result to the image synthesis section 374.

If none of the R and B signals obtained from the photoelectric conversion elements 214 does not reach the saturation level, namely, if the subject illumination is a level at which output from the photoelectric conversion elements 214 is not saturated, the image synthesis section 374 outputs the color image data generated in the color image data generation section 371 as record image data as it is. On the other hand, if any of the R signals or B signals obtained from the photoelectric conversion elements 214 reaches the saturation level, namely, if the subject illumination is a level at which output from the photoelectric conversion elements 214 is saturated, the image synthesis section 374 combines the color image data generated in the color image data generation section 371 and the contour image data generated in the contour image data generation section 373 to generate record image data and outputs the record image data.

Figure 10:
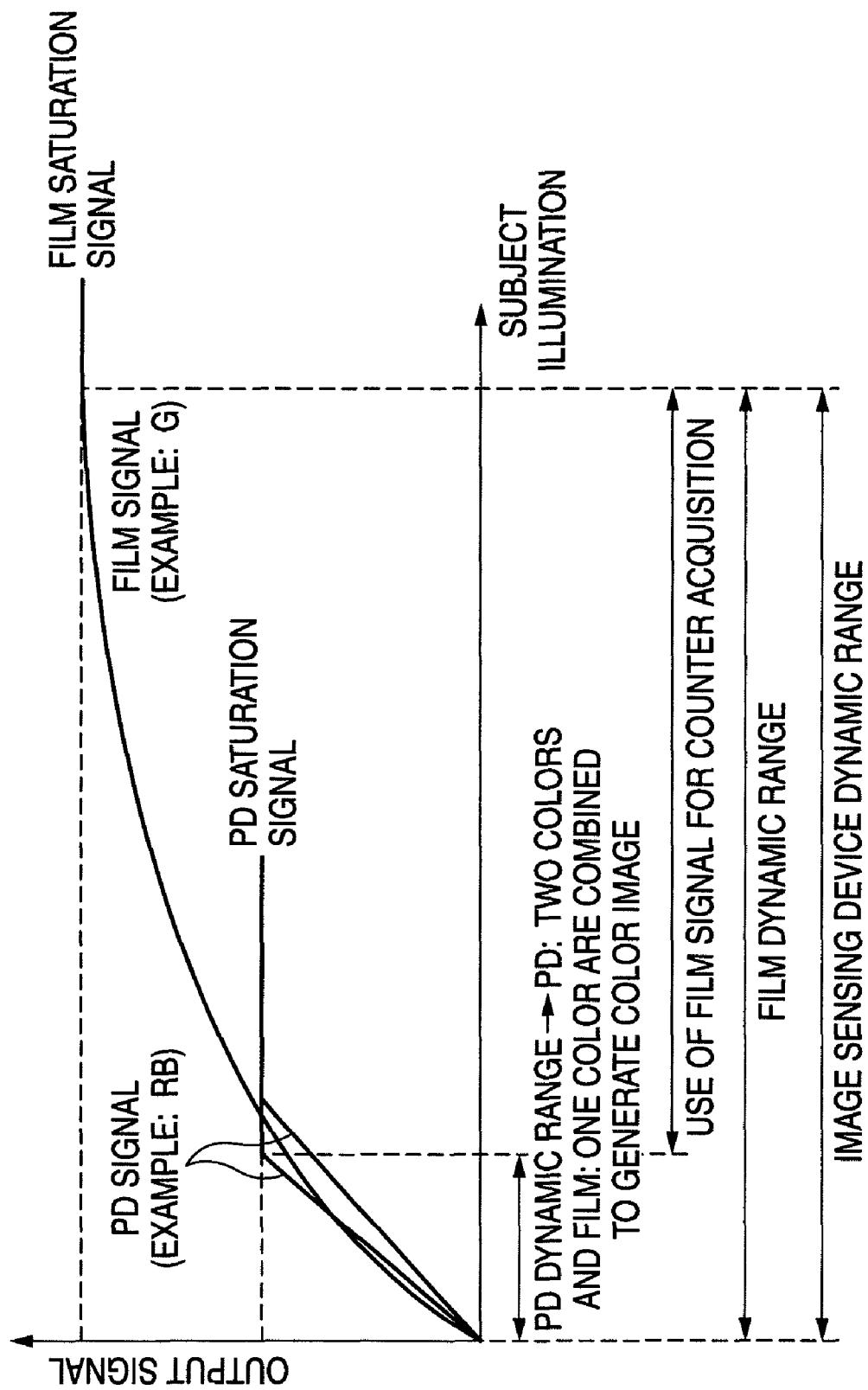
FIG. 10 is a drawing to show the relationship between an output signal (PD signal) from a photoelectric conversion element relative to subject illumination and an output signal (film signal) from an organic photoelectric conversion element in a solid-state image sensing device of the third embodiment of the invention.

FIG. 10 is a drawing to show the relationship between an output signal (PD signal) from the photoelectric conversion element 214 relative to the subject illumination and an output signal (film signal) from the organic photoelectric conversion element.

As shown in FIG. 10, in the PD dynamic range, PD is not saturated and thus color image data faithfully reproducing the contours of a subject can be provided without combining contour image data with color image data. On the other hand, beyond the PD dynamic range, PD is saturated and thus color image data faithfully reproducing the contours of a subject can be provided by combining contour image data with color image data.

Next, the operation of the digital camera is as follows:

When a photographing command is given, an electronic shutter of the photoelectric conversion element 214 is "opened," a predetermined bias voltage is applied to a pixel electrode 225 and a common electrode 227, and picking up of a subject is started at the same time with the photoelectric conversion element 214 and the organic photoelectric conversion element under the control of an image sensing device drive section 10. At the expiration of the exposure time period, color image data is generated from the R and B signals obtained from the photoelectric conversion elements 214 and the G signal obtained from the organic photoelectric conversion element.

Next, whether or not the R, B signal obtained from the photoelectric conversion elements 214 reaches the saturation level is determined and if the saturation level is not reached, the generated color image data is output as record image data. On the other hand, if the saturation level is reached, G image data is generated from the G signal obtained from the organic photoelectric conversion element and contour image data is generated from the G image data. The contour image data and the color image data are combined into record image data and this record image data is output. The record image data is compressed and then the compressed data is recorded on a record medium 21.

As described above, according to the digital camera of the embodiment, if the subject illumination is a level at which output from the photoelectric conversion elements 214 is not saturated, the color image data can be generated using the R and B signals and the G signal and can be output as record image data; if the subject illumination is a level at which output from the photoelectric conversion elements 214 is saturated, the image data into which the color image data and the contour image data are combined can be output as record image data. Thus, if the subject illumination is low and white splattering, etc., does not occur, the color image data can be provided without performing contour extraction; if the subject illumination is high and white splattering occurs, the color image data faithfully reproducing the contours of the subject can be provided.

The saturation level determination section 375 shown in FIG. 9 may be omitted so that the image synthesis section 374 always outputs the image data into which the color image data and the contour image data are combined as record image data.

Fourth Embodiment

The advantage that color image data faithfully reproducing the contours can be provided even if output from the photoelectric conversion elements 214 is saturated as described in the first to third embodiments cannot be provided if the output signal from the photoelectric conversion film 226 is saturated. Then, in a fourth embodiment of the invention, a solid-state image sensing device 200 is driven so as to pick up an image of a subject after adjusting bias voltage to be applied to a pixel electrode 225 and a common electrode 227 so that an output signal from a photoelectric conversion film 226 does not reach a saturation level by the image sensing device drive section 10 of the digital camera shown in FIG. 3.

Figure 11:
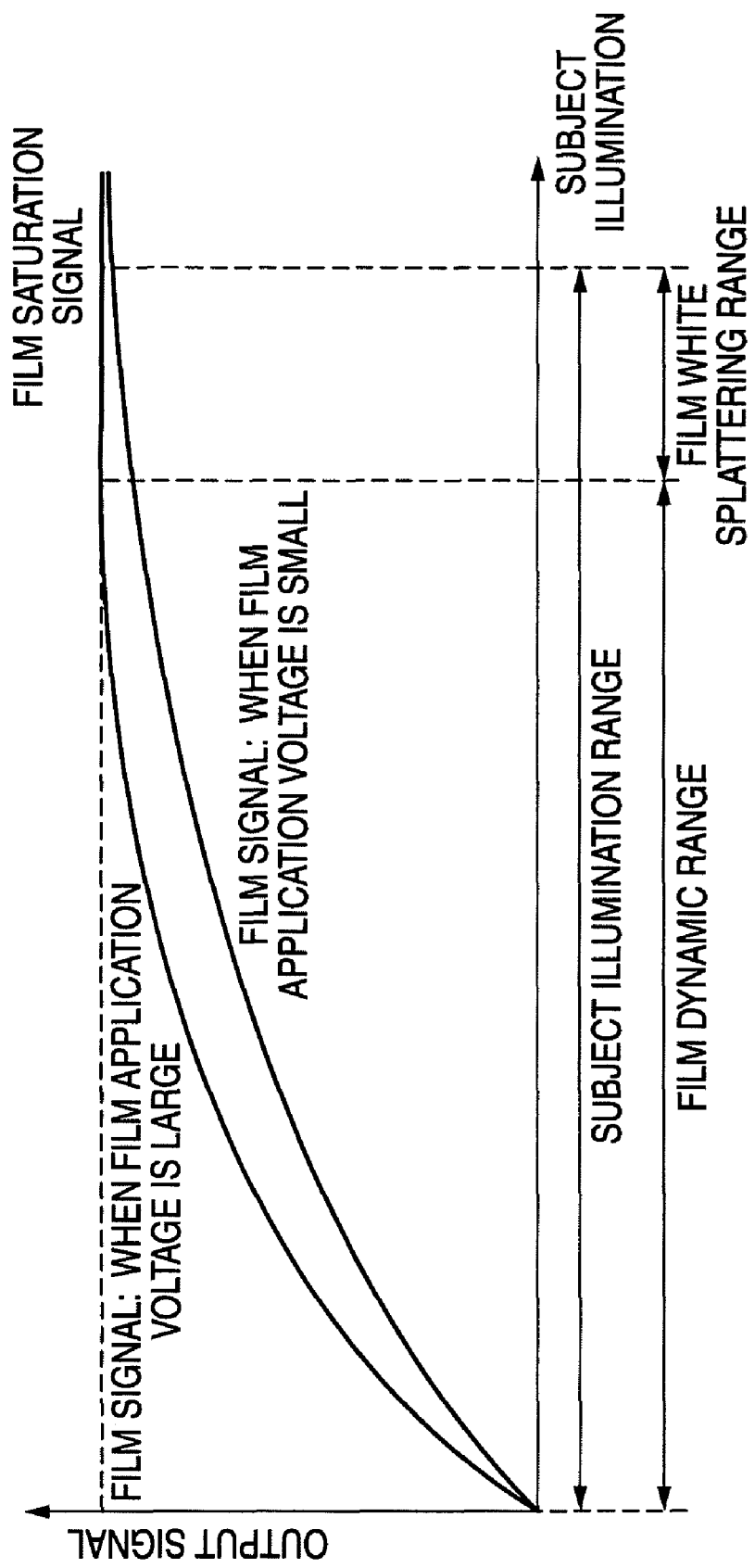
FIG. 11 is a drawing to show the relationship between a bias voltage applied to a photoelectric conversion film and an output signal from the photoelectric conversion film.

FIG. 11 is a drawing to show the relationship between the bias voltage applied to the photoelectric conversion film 226 and the output signal from the photoelectric conversion film 226.

As shown in FIG. 11, it is seen that the larger the bias voltage, the larger the level of the output signal from the photoelectric conversion film 226 even if the subject illumination is the same. In other words, it is seen that the sensitivity of the photoelectric conversion film 226 is proportional to the bias voltage. Thus, the following becomes effective: If the subject contains a high-illumination area and the output signal reaches the saturation level in the high-illumination area (the dynamic range is insufficient), the voltage to be applied to the photoelectric conversion film 226 is lessened for widening the dynamic range; whereas, if the output signal in the high-illumination area has a considerable margin to the saturation level (the dynamic range is sufficient), the voltage to be applied to the photoelectric conversion film 226 is increased for narrowing the dynamic range to improve the sensitivity.

A digital camera of the embodiment is as follows: In the digital camera described in the first to third embodiments, the command from the system control section 11 determines whether or not the output signal from the photoelectric conversion film 226 reaches the saturation level and if the output signal reaches the saturation level, the image sensing device drive section 10 is controlled so as to lessen the voltage to be applied to the photoelectric conversion film 226 for widening the dynamic range, whereby photographing can be started in a state in which the output signal of the photoelectric conversion film 226 is not saturated.

Figure 12:
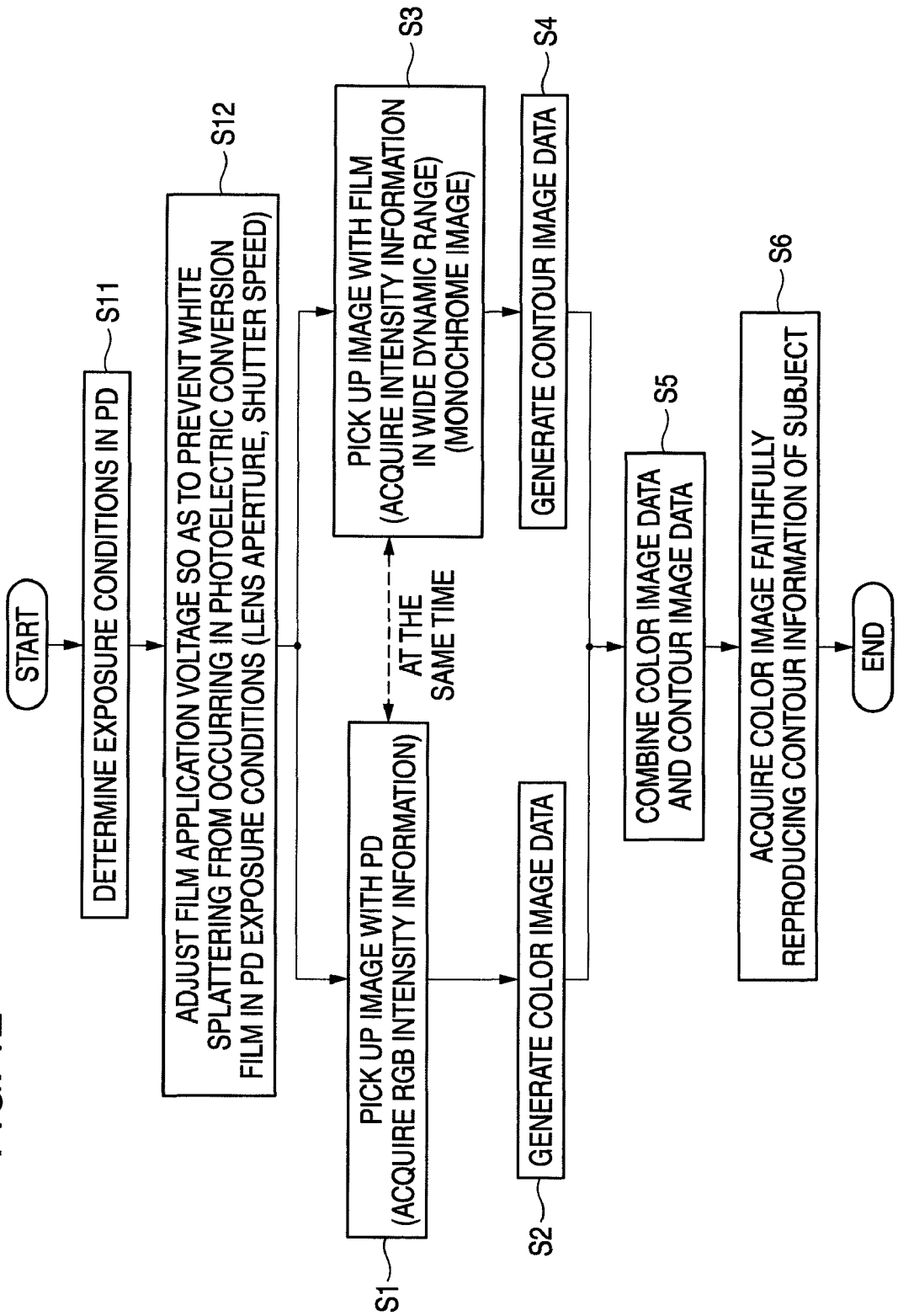
FIG. 12 is a flowchart to describe the photographing operation of a digital camera of a fourth embodiment of the invention.

Next, the operation of the digital camera of the fourth embodiment is as follows:

FIG. 12 is a flowchart to describe the photographing operation of the digital camera of the fourth embodiment of the invention. Steps identical with those in FIG. 7 are denoted by the same step numbers in FIG. 12. FIG. 13 is a detailed flowchart of step S13 shown in FIG. 12.

When a shutter button is pressed halfway down, the system control section 11 determines exposure conditions of the photoelectric conversion elements 214 (lens aperture, shutter speed, etc.,) based on photometric data obtained from a light reception section 13 and the like (step S11). Next, the system control section 11 adjusts the voltage to be applied to the photoelectric conversion film 226 through the image sensing device drive section 10 so that the output signal from the photoelectric conversion film 226 reaching the saturation level does not exist in image picking up under the determined exposure conditions (step S12).

Specifically, first the system control section 11 controls the image sensing device drive section 10 for performing preliminary image picking up under the determined exposure conditions, and determines whether or not an area (pixel) where the output signal from the photoelectric conversion film 226 reaches the saturation level from the signal obtained from the photoelectric conversion film 226 by performing the preliminary image picking up (step S121). If a saturated area exists, the system control section 11 lessens the voltage to be applied to the photoelectric conversion film 226 through the image sensing device drive section 10 (step S122). Next, the system control section 11 again performs preliminary image picking up and determines whether or not an area (pixel) where the output signal from the photoelectric conversion film 226 reaches the saturation level from the signal obtained from the photoelectric conversion film 226 by performing the preliminary image picking up (step S123). If a saturated area exists, the system control section 11 goes to step S122; if a saturated area does not exist, the system control section 11 terminates the adjustment of the voltage to be applied to the photoelectric conversion film 226 (step S127).

If it is determined at step S121 that a saturated area does not exist, the system control section 11 increases the voltage to be applied to the photoelectric conversion film 226 through the image sensing device drive section 10 (step S124). Next, the system control section 11 again performs preliminary image picking up and determines whether or not an area (pixel) where the output signal from the photoelectric conversion film 226 reaches the saturation level from the signal obtained from the photoelectric conversion film 226 by performing the preliminary image picking up (step S125). If a saturated area does not exist, the system control section 11 goes to step S124; if a saturated area exists, the system control section 11 sets the voltage to be applied to the photoelectric conversion film 226 to the voltage set at step S124 executed just before (step S126) and terminates the adjustment (step S127).

If the shutter button is pressed all the way down and an image picking up command is given after the adjustment of the voltage to be applied to the photoelectric conversion film 226, the system control section 11 drives based on the determined exposure conditions and applies the adjusted voltage to the photoelectric conversion film 226 through the image sensing device drive section 10 and executes the operation on and after step S1, S3.

Thus, according to the embodiment, the actual image picking up can be started in a state in which the output signal of the photoelectric conversion film 226 is not saturated, so that it is made possible to reliably provide the advantage that color image data faithfully reproducing the contours can be provided even if output of the photoelectric conversion elements 214 is saturated.

The present application claims foreign priority based on Japanese Patent Application (JP 2007-211507) filed Aug. 14, 2007, Japanese Patent Application (JP 2007-211508) filed Aug. 14, 2007, the contents of which is incorporated herein by reference.

What is claimed is:

1. An image pickup apparatus comprising:
a solid-state image sensing device that includes a plurality of pixels, each of the pixels including:
   a photoelectric conversion film that is formed above a semiconductor substrate for absorbing light in a specific wave range and generating a charge responsive thereto; and
   a photoelectric conversion element that is formed in the semiconductor substrate below the photoelectric conversion film and is made up of at least three types of photoelectric conversion elements for detecting light in different wave ranges, of visible light, wherein the photoelectric conversion film absorbs light in a wave range different from the wave ranges detected in the at least three types of photoelectric conversion elements and generates a charge responsive to the absorbed light;
a monochrome image data generation unit that generates monochrome image data provided by providing pixel data corresponding to each pixel with color information obtained from the photoelectric conversion film from a first image pickup signal obtained from the photoelectric conversion film of the pixels;
a color image data generation unit that generates color image data provided by providing pixel data corresponding to each pixel with three pieces of color information using at least a second image pickup signal obtained from the photoelectric conversion elements of the pixels, of the first image pickup signal obtained from the photoelectric conversion film of the pixels and the second image pickup signal; and
a record image data generation unit that generates record image data using the monochrome image data and the color image data.

2. The image pickup apparatus as claimed in claim 1, wherein
the different types of photoelectric conversion elements are three types of photoelectric conversion elements for detecting light in different wave ranges, of visible light,
the photoelectric conversion film absorbs light in an infrared wave range and generates a charge responsive to the absorbed light, and
the color image data generation unit generates the color image data using the second image pickup signal.

3. The image pickup apparatus as claimed in claim 1, wherein
the different types of photoelectric conversion elements are three types of photoelectric conversion elements for detecting light in different wave ranges, of visible light,
the photoelectric conversion film absorbs light in a wave range different from the wave ranges detected in the three types of photoelectric conversion elements, of visible light and generates a charge responsive to the absorbed light, and
the color image data generation unit generates the color image data using the first image pickup signal and the second image pickup signal.

4. The image pickup apparatus as claimed in claim 1, wherein
the record image data generation unit comprises:
a contour image data generation unit that extracts contour information from the monochrome image data to generate contour image data; and
an image synthesis unit that combines the color image data and the contour image data into image data and outputting the image data as the record image data.

5. The image pickup apparatus as claimed in claim 4, wherein,
in a case where subject illumination is a level at which output from the photoelectric conversion element is not saturated, the image synthesis unit outputs the color image data as the record image data as it is and if subject illumination is a level at which output from the photoelectric conversion element is saturated, the image synthesis unit outputs the image data into which the color image data and the contour image data into image data are combined as the record image data.

6. The image pickup apparatus as claimed in claim 1, further comprising:
an exposure condition determination unit that determines an exposure condition of the photoelectric conversion element; and
an application voltage adjustment unit that adjusts the voltage to be applied to the photoelectric conversion film so that the signals from the photoelectric conversion film contained in the pixels do not contain a signal exceeding a saturation level in image picking up under the exposure condition determined by the exposure condition determination unit,
wherein
an image is picked up based on the exposure condition in a state in which the voltage adjusted by the application voltage adjustment unit is applied to the photoelectric conversion film.

7. An image pickup apparatus comprising:
a solid-state image sensing device that includes a plurality of pixels, each of the pixels including:
a photoelectric conversion film that is formed above a semiconductor substrate for absorbing light in a specific wave range and generating a charge responsive thereto; and
a photoelectric conversion element being formed in the semiconductor substrate below the photoelectric conversion film and is made up of two types of photoelectric conversion elements for detecting light in different wave ranges, of visible light, wherein the photoelectric conversion film absorbs light in a wave range different from the wave ranges detected in the two types of photoelectric conversion elements, of visible light and generates a charge responsive to the absorbed light;
a monochrome image data generation unit that generates monochrome image data provided by providing pixel data corresponding to each pixel with color information obtained from the photoelectric conversion film from a first image pickup signal obtained from the photoelectric conversion film of the pixels;
a color image data generation unit that generates color image data provided by providing pixel data corresponding to each pixel with three pieces of color information using the first image pickup signal obtained from the photoelectric conversion film of the pixels and a second image pickup signal obtained from the photoelectric conversion elements of the pixels; and
a record image data generation unit that generates record image data using the monochrome image data and the color image data.

8. The image pickup apparatus as claimed in claim 7, wherein
the record image data generation unit comprises:
a contour image data generation unit that extracts contour information from the monochrome image data to generate contour image data; and
an image synthesis unit that combines the color image data and the contour image data into image data and outputting the image data as the record image data.

9. The image pickup apparatus as claimed in claim 8, wherein,
in a case where subject illumination is a level at which output from the photoelectric conversion element is not saturated, the image synthesis unit outputs the color image data as the record image data as it is and if subject illumination is a level at which output from the photoelectric conversion element is saturated, the image synthesis unit outputs the image data into which the color image data and the contour image data into image data are combined as the record image data.

10. A signal processing method of processing a signal obtained from a solid-state image sensing device including a plurality of pixels, each of the pixels including:
a photoelectric conversion film being formed above a semiconductor substrate for absorbing light in a specific wave range and generating a charge responsive thereto; and
a photoelectric conversion element being formed in the semiconductor substrate below the photoelectric conversion film and is made up of at least three types of photoelectric conversion elements for detecting light in different wave ranges, of visible light, wherein the photoelectric conversion film absorbs light in a wave range different from the wave ranges detected in the at least three types of photoelectric conversion elements and generates a charge responsive to the absorbed light,
the signal processing method comprising:
generating monochrome image data that is provided by providing pixel data corresponding to each pixel with color information obtained from the photoelectric conversion film from a first image pickup signal obtained from the photoelectric conversion film of the pixels;
generating color image data that is provided by providing pixel data corresponding to each pixel with three pieces of color information using at least a second image pickup signal obtained from the photoelectric conversion elements of the pixels, of the first image pickup signal obtained from the photoelectric conversion film of the pixels and the second image pickup signal; and
generating record image data that uses the monochrome image data and the color image data.

11. The signal processing method as claimed in claim 10, wherein
the generating of record image data comprises:
extracting contour information from the monochrome image data to generate contour image data; and
combining the color image data and the contour image data into image data and outputting the image data as the record image data.

12. A signal processing method of processing a signal obtained from a solid-state image sensing device including a plurality of pixels, each of the pixels including:
a photoelectric conversion film being formed above a semiconductor substrate for absorbing light in a specific wave range and generating a charge responsive thereto; and
a photoelectric conversion element being formed in the semiconductor substrate below the photoelectric conversion film and is made up of two types of photoelectric conversion elements for detecting light in different wave ranges, of visible light, wherein the photoelectric conversion film absorbs light in a wave range different from the wave ranges detected in the two types of photoelectric conversion elements, of visible light and generates a charge responsive to the absorbed light, the signal processing method comprising:

generating monochrome image data that is provided by providing pixel data corresponding to each pixel with color information obtained from the photoelectric conversion film from a first image pickup signal obtained from the photoelectric conversion film of the pixels;

generating color image data that is provided by providing pixel data corresponding to each pixel with three pieces of color information using the first image pickup signal obtained from the photoelectric conversion film of the pixels and a second image pickup signal obtained from the photoelectric conversion elements of the pixels; and generating record image data that uses the monochrome image data and the color image data.

* * * * *